(12) United States Patent
Ohsawa

(10) Patent No.: US 7,352,642 B2
(45) Date of Patent: Apr. 1, 2008

(54) SEMICONDUCTOR MEMORY DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 91 days.

(21) Appl. No.: 11/331,169

(22) Filed: Jan. 13, 2006

(65) Prior Publication Data

US 2007/0014174 A1 Jan. 18, 2007

(30) Foreign Application Priority Data

Jun. 30, 2005 (JP) ............................. 2005-191683

(51) Int. Cl.
*G11C 7/00* (2006.01)

(52) U.S. Cl. .................. 365/222; 365/182; 365/182.25

(58) Field of Classification Search ................ 365/222, 365/182, 185.25, 236, 154
See application file for complete search history.

(56) References Cited

U.S. PATENT DOCUMENTS

| 6,711,093 | B1 * | 3/2004 | Shore et al. ................ 365/236 |
| 6,965,526 | B2 * | 11/2005 | Cavaleri et al. ............ 365/236 |
| 2005/0185497 | A1 * | 8/2005 | Ikeda et al. ............ 365/230.06 |
| 2005/0195680 | A1 | 9/2005 | Higashi et al. |
| 2007/0070745 | A1 * | 3/2007 | Versen et al. ............... 365/203 |

OTHER PUBLICATIONS

S. Okhonin, et al., "Principles of Transient Charge Pumping on Partially Depleted SOI Mosfets", IEEE Electron Device Letters, vol. 23, No. 5, May 2002, pp. 279-281.
U.S. Appl. No. 11/331,169, filed Jan. 13, 2006, Ohsawa.
U.S. Appl. No. 11/539,447, filed Oct. 6, 2006, Ohsawa.

* cited by examiner

*Primary Examiner*—Anh Phung
*Assistant Examiner*—Dang Nguyen
(74) *Attorney, Agent, or Firm*—Oblon, Spivak, McClelland, Maier & Neustadt, P.C.

(57) ABSTRACT

A semiconductor memory device includes a memory cell including a floating body region and storing data on the basis of the amount of charges in the floating body region; word lines; a counter cell array including counter cells provided to correspond to the word lines, the counter cell array storing the number of times of activation of the word lines; an adder incrementing the number of times of activation, the number of times of activation being read from the counter cell array; a counter buffer circuit temporarily storing the number of times of activation and writing back the incremented number of times of activation to the counter cell array; and a refresh request circuit outputting an instruction to execute a refresh operation to the memory cells connected to the word line when the number of times of activation reaches a predetermined value.

16 Claims, 30 Drawing Sheets

NOMAL REFRESH OPERATION

READ/WRITE OPERATION, BEGINNING OF EXTRA REFRESH OPERATION

READ/WRITE OPERATION, BEGINNING OF EXTRA REFRESH OPERATION

EXTRA REFRESH OPERATION

EXTRA REFRESH OPERATION

SEMICONDUCTOR MEMORY DEVICE

CROSS-REFERENCE TO RELATED APPLICATION

This application is based upon and claims the benefit of priority from the prior Japanese Patent Applications No. 2005-191683, filed on Jun. 30, 2005, the entire contents of which are incorporated herein by reference.

BACKGROUND OF THE INVENTION

1. Field of the Invention

The present invention relates to a semiconductor memory device.

2. Background Art

Recently, as a semiconductor memory device expected to replace a dynamic random access memory (DRAM), a floating body cell (FBC) memory device is known. The FBC memory device is formed by NMOS transistors each of which includes a floating body (also referred to as "body region") on a silicon on insulator (SOI) substrate and each of which can store data "1" or "0" according to the number of holes accumulated in this body region.

An FBC memory consisting of a field effect transistor (FET) has a problem of the following charge pumping phenomenon. In a case that the memory cell is an N-type FET, a part of electrons in an inversion layer are trapped by an interface state on an interface between a gate oxide film and the body region when the memory cell is turned on. Holes accumulated in the body region are recombined with the electrons and disappear. Normally, if a word line is activated between a certain refresh operation and the next refresh operation, no data is written back to unselected FBC memory cells. If the unselected FBC memory cells are repeatedly turned on and off when data is read from and written to the selected memory, therefore, the holes accumulated in body regions of the unselected memory cells each storing data "1" gradually decrease. As a result, data "1" of the unselected memory cells are changed to data "0", respectively.

Therefore, an FBC memory cell of the FBC memory is not a destructive read-out cell differently from a memory cell of the DRAM but cannot be said to be a complete non-destructive read-out cell. It is discovered that the FBC memory cell is a so-called quasi non-destructive read-out cell.

SUMMARY OF THE INVENTION

A semiconductor memory device according to an embodiment of the invention comprises a memory cell including a floating body region and storing data on the basis of the amount of charges in the floating body region; a memory cell array including a plurality of the memory cells; word lines connected to the memory cells arranged in rows of the memory cell array; a counter cell array including counter cells provided to correspond to the word lines, the counter cell array storing the number of times of activation of the word lines; an adder incrementing the number of times of activation of one of the word lines, the number of times of activation being read from the counter cell array in read operation of the data from the memory cell or in write operation of the data to the memory cell; a counter buffer circuit temporarily storing the number of times of activation of the word line and writing back the incremented number of times of activation of the word line to the counter cell array; and a refresh request circuit outputting an instruction to execute a refresh operation to the memory cells connected to the word line when the number of times of activation of the word line reaches a predetermined value.

DETAILED DESCRIPTION OF THE INVENTION

Embodiments of the present invention will be described more specifically with reference to the drawings. Note that the invention is not limited by the embodiments.

FIRST EMBODIMENT

Figure 1:
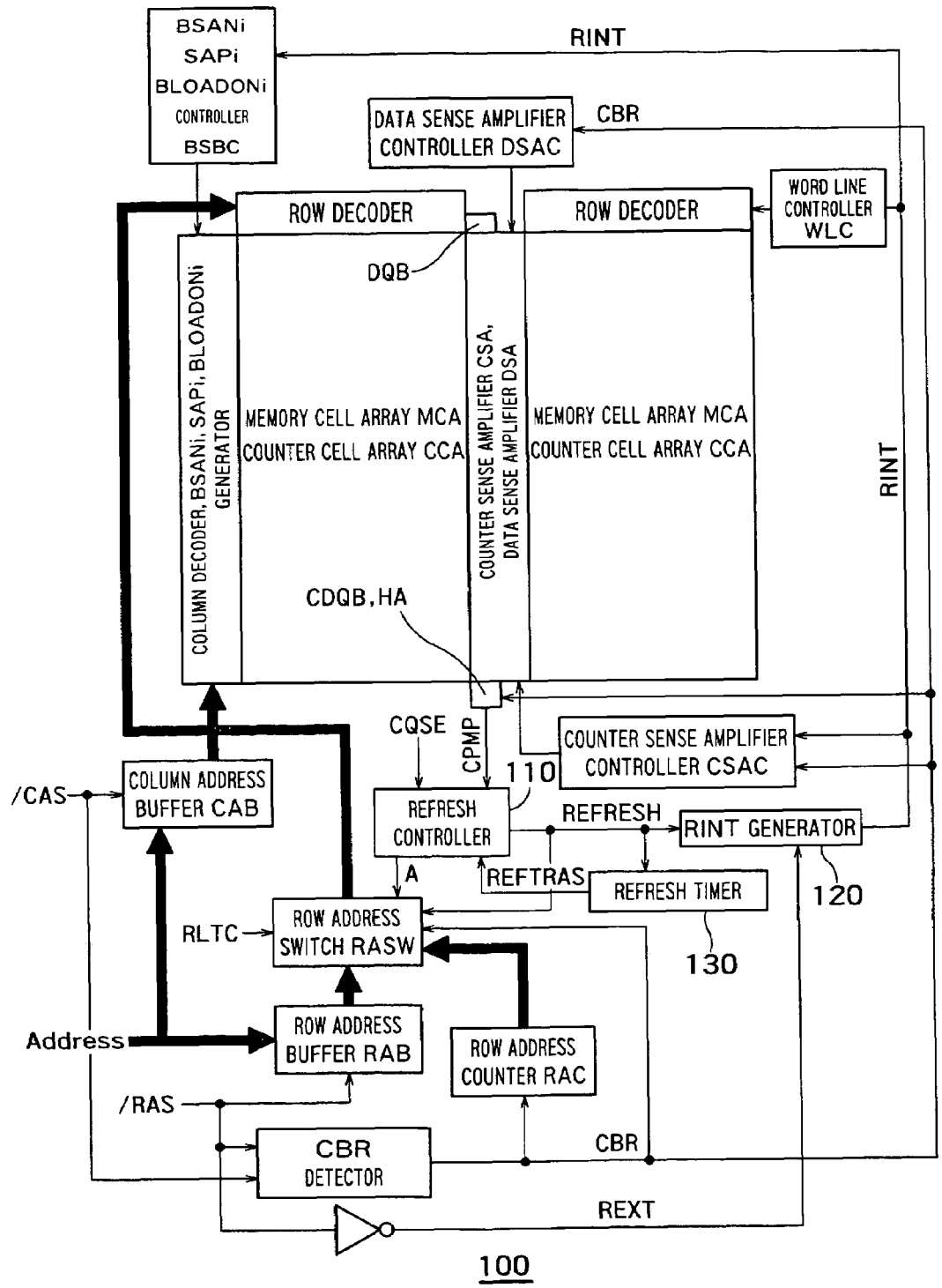
FIG. 1 is a block diagram showing a configuration of a semiconductor memory device 100 according to a first embodiment of the present invention.

FIG. 1 is a block diagram showing a configuration of a semiconductor memory device 100 according to a first embodiment of the present invention. The semiconductor memory device 100 includes a data sense amplifier DSA and a counter sense amplifier CSA. A memory cell array MCA and a counter cell array CCA are provided on each side of the data sense amplifier DSA and the counter sense amplifier CSA, respectively. A row decoder selects a word line of the memory cell array MCA and the counter cell array CCA, whereas a column decoder selects a bit line of the memory cell array MCA.

A counter DQ buffer CDQB and a half adder HA are connected to the counter sense amplifier CSA. The counter sense amplifier CSA amplifies binary data corresponding to the number of times of activating a certain word line (hereinafter, also referred to as "the number of times of activation"). The counter DQ buffer CDQB and the half adder HA increment the number of times of activation when this word line is activated and write the incremented number of times of activation to the counter sense amplifier CSA. If the number of times of activation reaches a predetermined value, the counter DQ buffer CDQB outputs a signal CPMP. The signal CPMP is used to execute an extra refresh operation apart from a normal, regular refresh operation.

A refresh controller 110 latches the signal CPMP and controls a timing of executing the refresh operation. The refresh controller 110 outputs a refresh signal REFRESH to a row address switch RASW, a RINT generator 120, and a refresh timer 130. The row address switch RASW receives the refresh signal REFRESH and transmits an address, which is stored in a row address counter RAC and needs the extra-refresh operation, to the row decoder. The RINT generator 120 receives the signal REFRESH and an external RAS signal REXT and outputs an internal RAS signal RINT to a word line controller WLC and to a BSANi-SAPi-BLOADONi controller BSBC. In response to the internal RAS signal RINT, the extra refresh operation is executed. At this moment, a CAS before RAS signal CBR activated in the normal refresh operation need not to be activated.

In the normal refresh operation, a CAS before RAS detector inputs signals /CAS and /RAS, and outputs the signal CBR to the row address counter RAC, the row address switch RASW, a counter sense amplifier controller CSAC, the half adder HA, and a data sense amplifier controller DSAC. The word line designated by the row address counter RAC is thereby refreshed. At this time, the row address counter RAC sequentially designates word lines, for example, in order of address.

Figure 2:
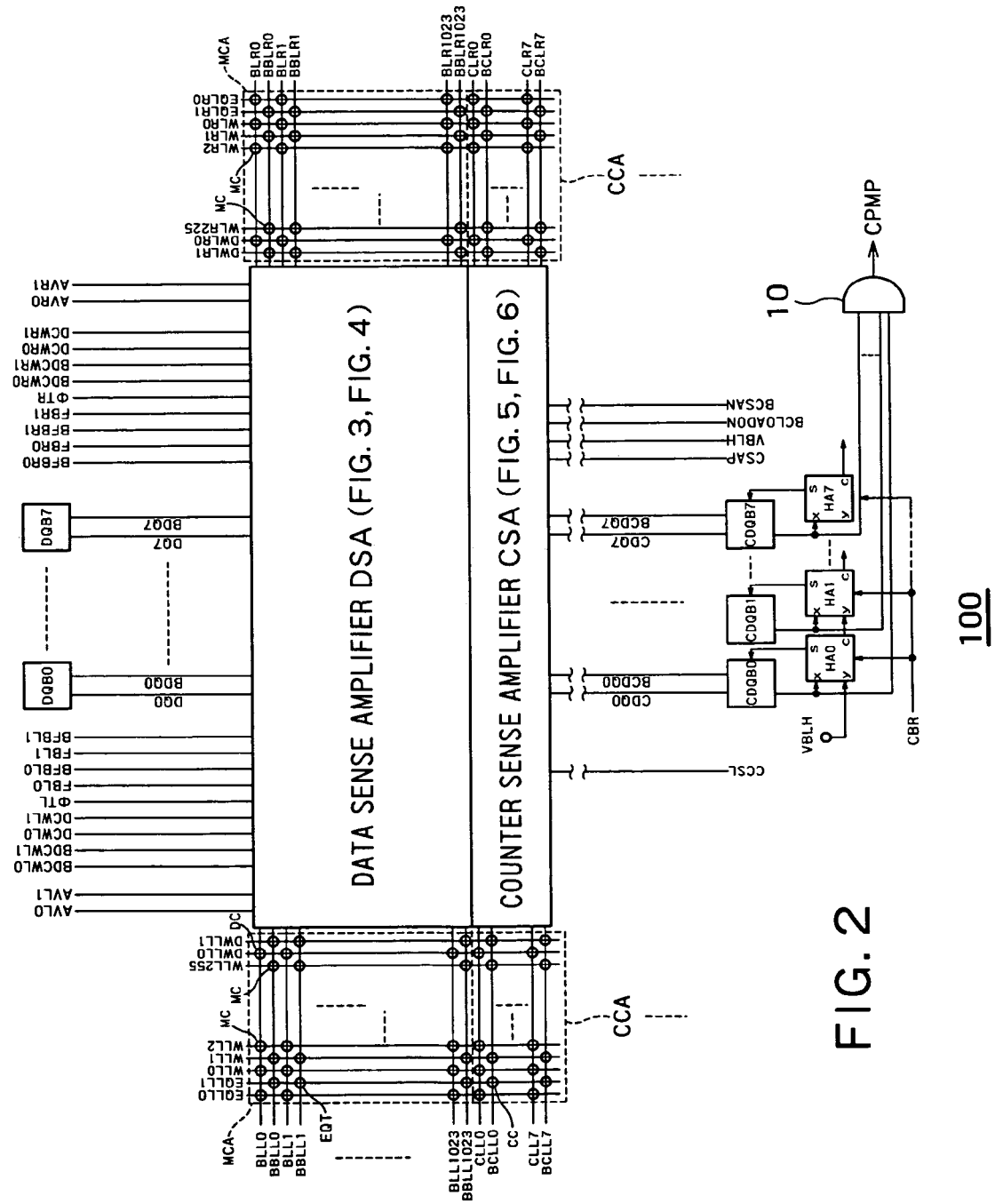
FIG. 2 is a circuit diagram showing the configuration of the semiconductor memory device 100.
Figure 10:
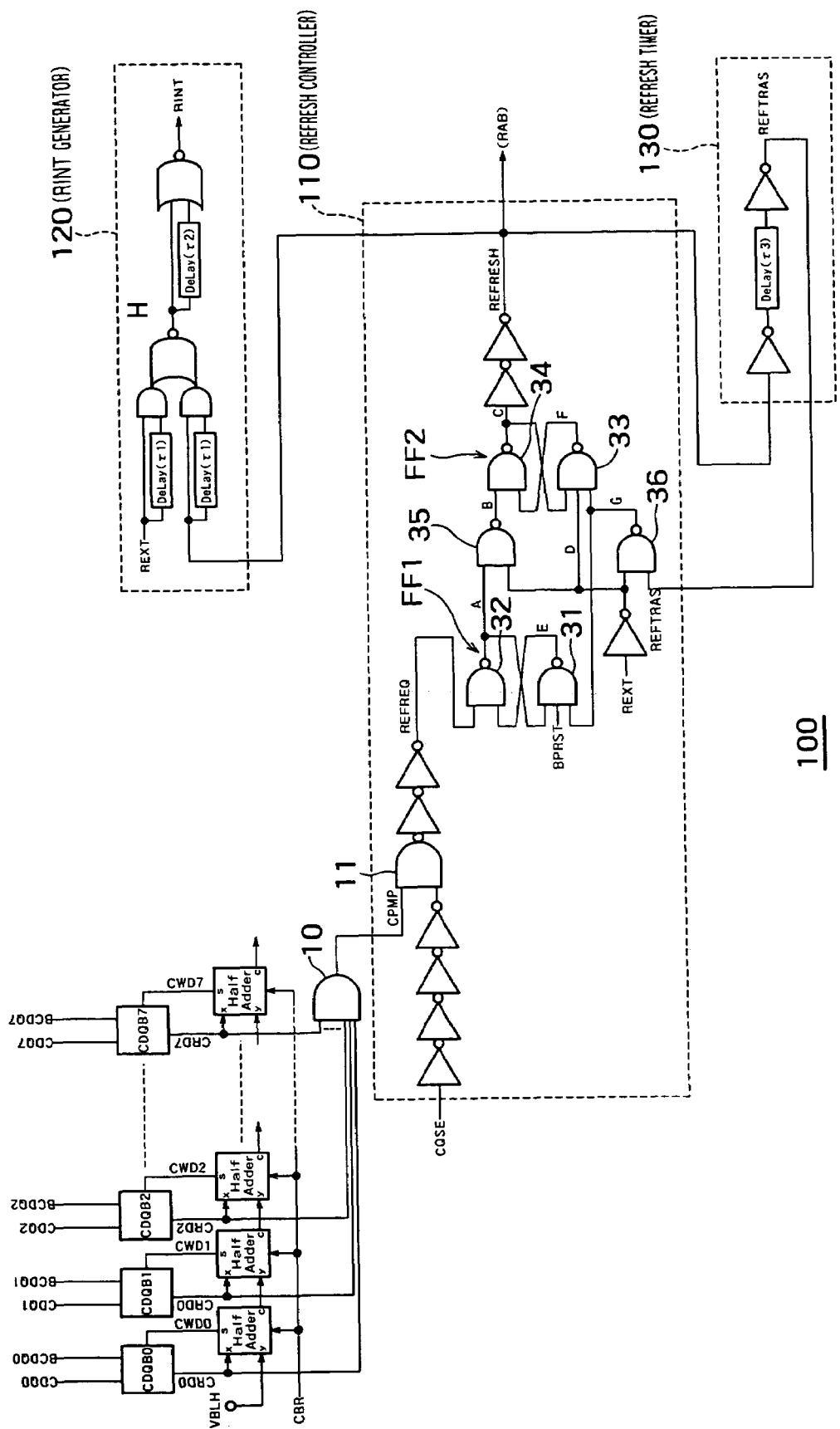
FIG. 10 is a circuit diagram showing interiors of the refresh controller 110, the RINT generator 120, and the refresh timer 130.

FIG. 2 is a circuit diagram showing the configuration of the semiconductor memory device 100 in more detail. The data sense amplifier DSA will be described later in detail with reference to FIGS. 3 and 4. The counter sense amplifier CSA will be described later in detail with reference to FIGS. 5 and 6. Circuits connected to an AND gate 10 are shown in FIG. 10.

A plurality of data bit lines are provided on both sides of one data sense amplifier DSA. Data bit lines BLL0 to BLL1023 and BBLL0 to BBLL1023 are provided on one side of the data sense amplifier DSA, and data bit lines BLR0 to BLR1023 and BBLR0 to BBLR1023 are provided on the other side thereof. In addition, 256 word lines WLL0 to WLL255 are provided on one side of one data sense amplifier DSA, and 256 word lines WLR0 to WLR255 are provided on the other side thereof.

Counter bit lines CLL0 to CLL7 and BCLL0 to BCLL7 are provided on one side of the counter sense amplifier CSA, and counter bit lines CLR0 to CLR7 and BCLR0 to BCLR7 are provided on the other side thereof. The word lines WLL0 to WLL255 and WLR0 to WLR255 common to the data sense amplifier DSA and the counter sense amplifier CSA are provided on both sides of the counter sense amplifier CSA, respectively.

The memory cell array MCA and the counter cell array CCA are provided on each side of the data sense amplifier DSA and the counter sense amplifier CSA, respectively. The memory cell array MCA and the counter cell array CCA provided on one side of the data sense amplifier DSA and the counter sense amplifier CSA are equal in configuration to the memory cell array MCA and the counter cell array CCA provided on the other side of the data sense amplifier DSA and the counter sense amplifier CSA, respectively. Therefore, the memory cell array MCA and the counter cell array CCA provided on one side of the data sense amplifier DSA and the counter cell amplifier CSA, respectively will be described but those on the other side thereof will not be described herein.

Memory cells MC and counter cells CC are provided at alternate intersecting points between the word lines and the bit lines. The memory cell MC may be an FBC memory including a floating body region. The FBC memory can store data by accumulating charges in or emitting charges from the floating body region. The counter cell CC is equal in configuration to the memory cell MC. In this embodiment, the memory cells MC are provided at intersecting points between even-numbered word lines WLL0, WLL2, WLL4, . . . and the data bit lines BLLi (where i=0 to 1023) and those between the odd-numbered word lines WLL1, WLL3, WLL5, . . . and the data bit lines BBLLi (where i=0 to 1023). Namely, in this embodiment, the semiconductor memory device 100 has a folded-type bit line configuration. It is, therefore, possible to set data bit lines BLLi and BBLLi as one bit line pair, and store data items as many as the word lines. Accordingly, the memory cell array MCA provided on one side of the data sense amplifier DSA shown in FIG. 2 can store data of 1024×256 bits. Further, the counter cells CC are provided at intersecting points between even-numbered word lines WLL0, WLL2, WLL4, . . . and the counter bit lines BCLLi (where i=0 to 7) and those between the odd-numbered word lines WLL1, WLL3, WLL5, . . . and the data bit lines CLLi (where i=0 to 7). If viewed from a row direction, eight counter cells CC are connected to one word line WLLj (where j=0 to 255). It is thereby possible to store the number of times of activation of the word line WLLj in the form of eight-bits data.

Equalizing signal lines EQLL0 and EQLL1 are interconnected to the memory cell array MCA and the counter cell array CCA. Equalizing transistors EQT that short the bit lines BLLi and BBLLi to source potentials of the memory cells MC are connected to the equalizing signal lines EQLL0 and EQLL1. The equalizing transistors EQT are provided at alternate intersecting points between the equalizing signal lines and the bit lines. The equalizing transistor EQT is equal in configuration to the memory cell MC.

Dummy word lines DWLL0 and DWLL1 are also interconnected to the memory cell array MCA and the counter cell array CCA. Dummy cells DC are connected to the dummy word lines DWLL0 and DWLL1. The dummy cells DC are provided at alternate intersecting points between the dummy word lines and the bit lines. Data "1" and data "0" are alternately written to the dummy cells DC along directions of the dummy word lines DWLL0 and DWLL1. The data in the dummy cell DC is used to generate a reference signal when the data is read from the memory cell MC. The dummy cell DC is also equal in configuration to the memory cell MC.

DQ buffers DQB0 to DQB7 are provided to correspond to the data sense amplifier DSA, and further amplify data amplified and detected by the data sense amplifier DSA. Counters DQ buffers CDQB0 to CDQB7 are provided to correspond to the counter sense amplifier CSA, and further amplify data on the number of times of activation amplified and detected by the counter sense amplifier CSA. Half adders HA0 to HA7 are provided to correspond to the counter DQ buffers CDQB0 to CDQB7, respectively. Each of the half adders HA0 to HA7 increments the number of times of activation of the word line WLj, which is read from the counter cell array CCA, in each time when data is read from or written to the memory cell MC. The counter DQ buffers CDQB0 to CDQB7 write the incremented numbers of times of activation back to the counter sense amplifier CSA. The counter DQ buffers CDQB0 to CDQB7, therefore, function as number-of-times-of-activation write circuits.

Outputs of the counter DQ buffers CDQB0 to CDQB7 are connected to one AND circuit 10. The AND circuit 10 functions as a refresh request circuit. Namely, if the outputs of the counter DQ buffers CDQB0 to CDQB7 are "11111111" (the number of times of activation of the word line WLj reaches 256), the AND circuit 10 outputs a high level (HIGH) as an indication signal for performing a refresh operation on the memory cells MC connected to the word line WLj. Since this refresh operation is executed at a different timing from that of executing the normal and regular refresh operation, it will be also referred to as "extra refresh operation". If the outputs of the counter DQ buffers CDQB0 to CDQB7 are less than "11111111" (the number of times of activation of the word line WLj is less than 256), the AND circuit 10 outputs a low level (LOW). In this case, the extra refresh operation is not executed.

The relationship between the number of times of activation of the word line and the charge pumping phenomenon will be described. It is assumed, for example, that a density $N_{it}$ of an interface state between silicon-silicon oxide films is about $N_{it}=1 \times 10^{10}$ cm$^{-2}$ and that a gate width (W) and a gate length (L) of the memory cell MC are 0.1 micrometer and 0.1 micrometer, respectively. If so, an area of the interface between a body region and a gate insulating film is about $1.0 \times 1.0^{-10}$ cm$^{-2}$ per memory cell MC and an average interface state per memory cell MC is about one. Accordingly, the number of holes that disappear within each memory cell MC by activating the word line once is about one.

In the FBC memory, the difference in the number of holes between the memory cell that stores the data "1" and the memory cell that stores the data "0" is about 1000. Consequently, if the number of times of activation of the word line is calculatively about 1000, the data "1" is completely changed to the data "0". In practice, if the number of times of activation of the word line is about 500, the risk of erroneously detecting the data "1" is increased. If the number of times of activation of the word line exceeds 200 to 500, it is substantially necessary to refresh all the memory cells MC connected to the word line. In this embodiment, therefore, if the number of times of activation of the word line WLj exceeds 256, the extra refresh operation is executed. As a result, the erroneous detection of the data "1" resulting from the charge pumping phenomenon can be suppressed.

Figure 3:
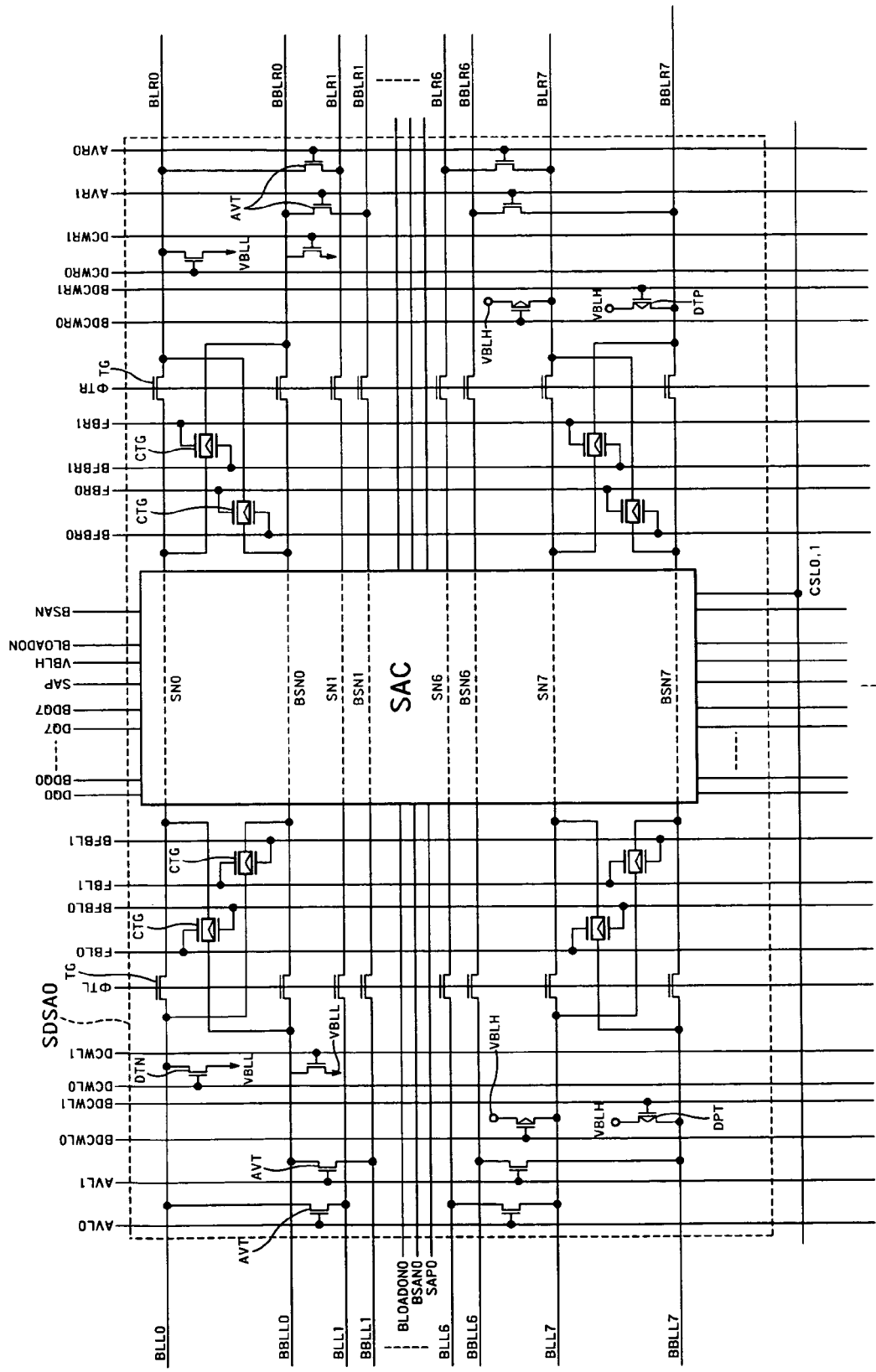
FIG. 3 is a circuit diagram showing a part of the data sense amplifier DSA.

FIG. 3 is a circuit diagram showing a part of the data sense amplifier DSA in detail. The data sense amplifier DSA is configured by arranging a plurality of structures equal to a sub-data sense amplifier SDSA0 shown in FIG. 3 in the row direction. The sub data sense amplifier SDSA0 is provided for eight data bit lines. If the number of data bit lines is, for example, 1024, the data sense amplifier DSA is configured by arranging 128 sub data sense amplifiers SDSAk (where k=0 to 127).

The data bit lines BLL0 to BLL7 are connected to sense nodes SN0 to SN7 through NMOS transfer gates TG, respectively. Likewise, the data bit lines BBLL0 to BBLL7 are connected to sense nodes BSN0 to BSN7 through NMOS transfer gates TG, respectively. Each transfer gate TG, which is controlled by a signal φTL, can electrically connect each data bit line to the corresponding sense node.

A CMOS transfer gate CTG can connect each sense node SNi to the data bit line BBLLi and connect each sense node BSNi to the data bit line BLLi. An NMOS of the CMOS transfer gate CTG is controlled by signal lines FBL0 and FBL1. A PMOS of the CMOS transfer gate CTG is controlled by signal lines BFBL0 and BFBL1.

Averaging transistors AVT are provided between the data bit lines BLL and between the data bit lines BBLL of adjacent data bit line pairs, respectively. The averaging transistors AVT are provided between, for example, the data bit lines BLLi and BLL(i+1) and between the data bit lines BBLLi and BBLL(i+1), respectively. These averaging transistors AVT are used to generate a reference signal by connecting the data "1" and the data "0" from the dummy cells DC to each other.

Further, NMOS transistors DTN are connected between the data bit lines BLLi, BBLLi (where i is an even number) and a low voltage source VBLL, respectively. It is thereby possible to write the data "0" to the dummy cells DC connected to the data bit lines BLLi and BBLLi, where i is an even number, respectively. PMOS transistors DTP are connected between the data bit lines BLLi, BBLLi (where i is an odd number) and a high voltage source VBLH, respectively. It is thereby possible to write the data "1" to the dummy cells DC connected to the data bit lines BLLi and BBLLi, where i is an odd number, respectively.

Figure 4:
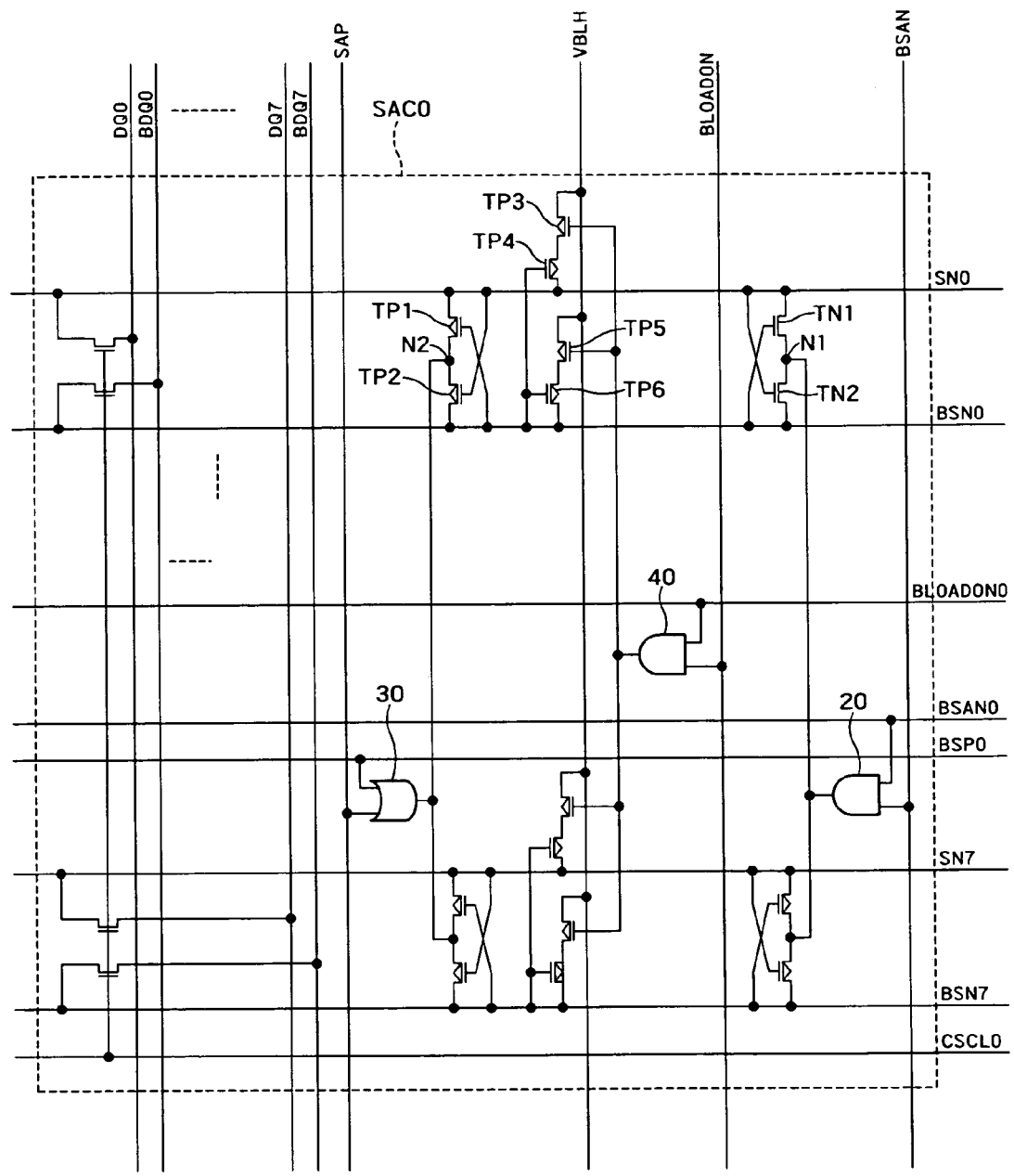
FIG. 4 is a circuit diagram showing an interior of a sense amplifier core SAC shown in FIG. 3.

FIG. 4 is a circuit diagram showing an interior of a sense amplifier core SAC shown in FIG. 3, in detail. NMOS transistors TN1 and TN2 are connected in series between the sense nodes BNi and BSNi. A node N1 between the NMOS transistors TN1 and TN2 is connected to an output of an AND gate 20. The AND gate 20 inputs signals from a signal line BSAN extending in a row direction and a signal line BSAN0 extending in a column direction, and outputs an AND therebetween. Gates of the transistors TN1 and TN2 are cross-coupled to each other.

Likewise, PMOS transistors TP1 and TP2 are connected in series between the sense node BNi and BSNi. A node N2 between the PMOS transistors TP1 and TP2 is connected to an output of an OR gate 30. The OR gate 30 inputs signals from a signal line SAP extending in the row direction and a signal line BSP0 extending in the column direction, and outputs an OR therebetween. Gates of the transistors TP1 and TP2 are cross-coupled to each other.

PMOS transistors TP3 and TP4 are connected in series between the high voltage source VBLH and the sense node SN0. PMOS transistors TP5 and TP6 are connected in series between the high voltage source VBLH and the sense node BSN0. Gates of the transistors TP3 and TP5 are connected to an output of an AND gate 40. The AND gate 40 inputs signals from signal lines BLOADON and BLOADON0 and outputs an AND therebetween. Gates of the transistors TP4 and TP6 are connected to the sense node BSN0 in common. Thus, the transistors TP3, TP4 and the transistors TP5, TP6 constitute current-mirrors between the sense nodes SN0 and BSN0.

Sense nodes SN0 to SN7 and BSN0 to BSN7 are connected to data input and output lines DQ0 to DQ7 and BDQ0 to BDQ7 through NMOSs, respectively. These NMOSs are controlled by a column select line CSL0.

The AND gates 20 and 40, the OR gate 30, and the signal lines SAP0, BSAN0, and BLOADON0 are provided per sub data sense amplifier SDSAk. Accordingly, if the number of data bit lines is 1024, the numbers of the AND gates 20 and 40, the OR gate 30, and the signal lines SAPk, BSANk, and BLOADONk are 128, respectively.

The signal lines SAPk, BSANk, and BLOADONk extending in the column direction include selection information on the data bit lines connected to the data sense amplifier DSA corresponding to these signal lines.

Figure 5:
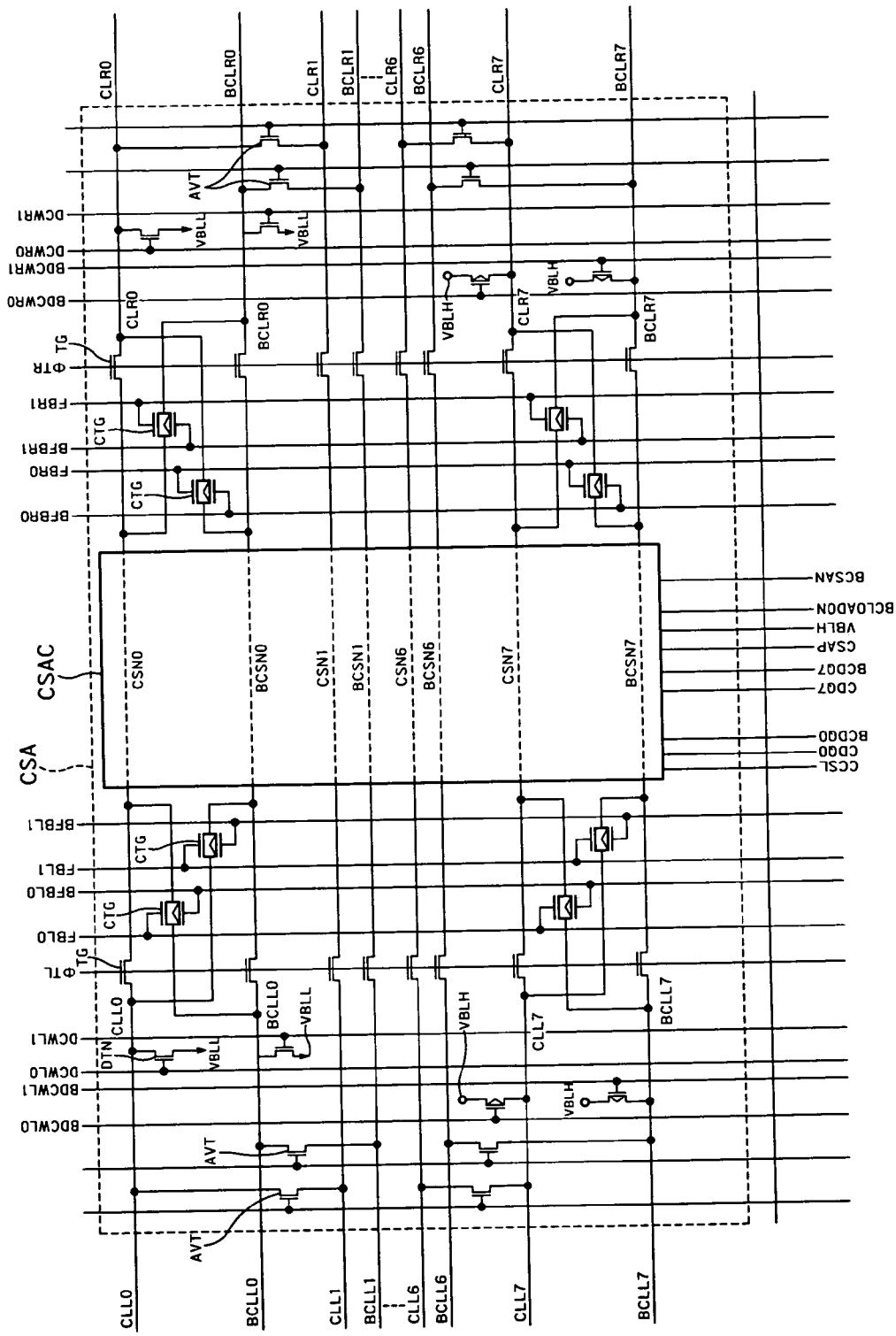
FIG. 5 is a circuit diagram showing an interior of the counter sense amplifier CSA.

FIG. 5 is a circuit diagram showing an interior of the counter sense amplifier CSA, in detail. The counter sense amplifier CSA is basically similar in configuration to the data sense amplifier DSA shown in FIG. 3. Differently from the data sense amplifier DSA, however, the counter sense amplifier CSA is controlled by dedicated driving signals BCSAN, CSAP, BCLOADON, CCSL, CDQ0 to CDQ7, and BCDQ0 to BCDQ7.

The counter sense amplifier CSA is provided to count the number of times of activation of a word line. It, therefore, suffices to provide one counter sense amplifier CSA per set of word lines WLL0 to WLL255.

The counter sense amplifier CDSA is provided for eight counter bit line pairs CLLi and BCLLi.

The counter bit lines CLL0 to CLL7 are connected to sense nodes CSN0 to CSN7 through NMOS transfer gates TG, respectively. Likewise, the counter bit lines BCLL0 to BCLL7 are connected to sense nodes BCSN0 to BCSN7 through NMOS transfer gates TG, respectively. Each transfer gate TG, which is controlled by a signal φTL, can electrically connect each counter bit line to the corresponding sense node.

A CMOS transfer gate CTG can connect each sense node CSNi to the counter bit line BCLLi and connect each sense node BCSNi to the counter bit line CLLi.

Averaging transistors AVT are provided between the counter bit lines CLL and between the counter bit lines BCLL of adjacent counter bit line pairs, respectively. The averaging transistors AVT are provided between, for example, the counter bit lines CLLi and CLL(i+1) and between the counter bit lines BCLLi and BCLL(i+1), respectively. These averaging transistors AVT are used to generate a reference signal by connecting the data "1" and the data "0" from the dummy cells DC to each other.

Further, NMOS transistors DTN are connected between the counter bit lines CLLi, BCLLi (where i is an even number) and a low voltage source VBLL, respectively. It is thereby possible to write the data "0" to the dummy cells DC connected to the counter bit lines CLLi and BCLLi, where i is an even number, respectively. PMOS transistors DTP are connected between the counter bit lines CLLi, BCLLi (where i is an odd number) and a high voltage source VBLH, respectively. It is thereby possible to write the data "1" to the dummy cells DC connected to the counter bit lines CLLi and BCLLi, where i is an odd number, respectively.

Figure 6:
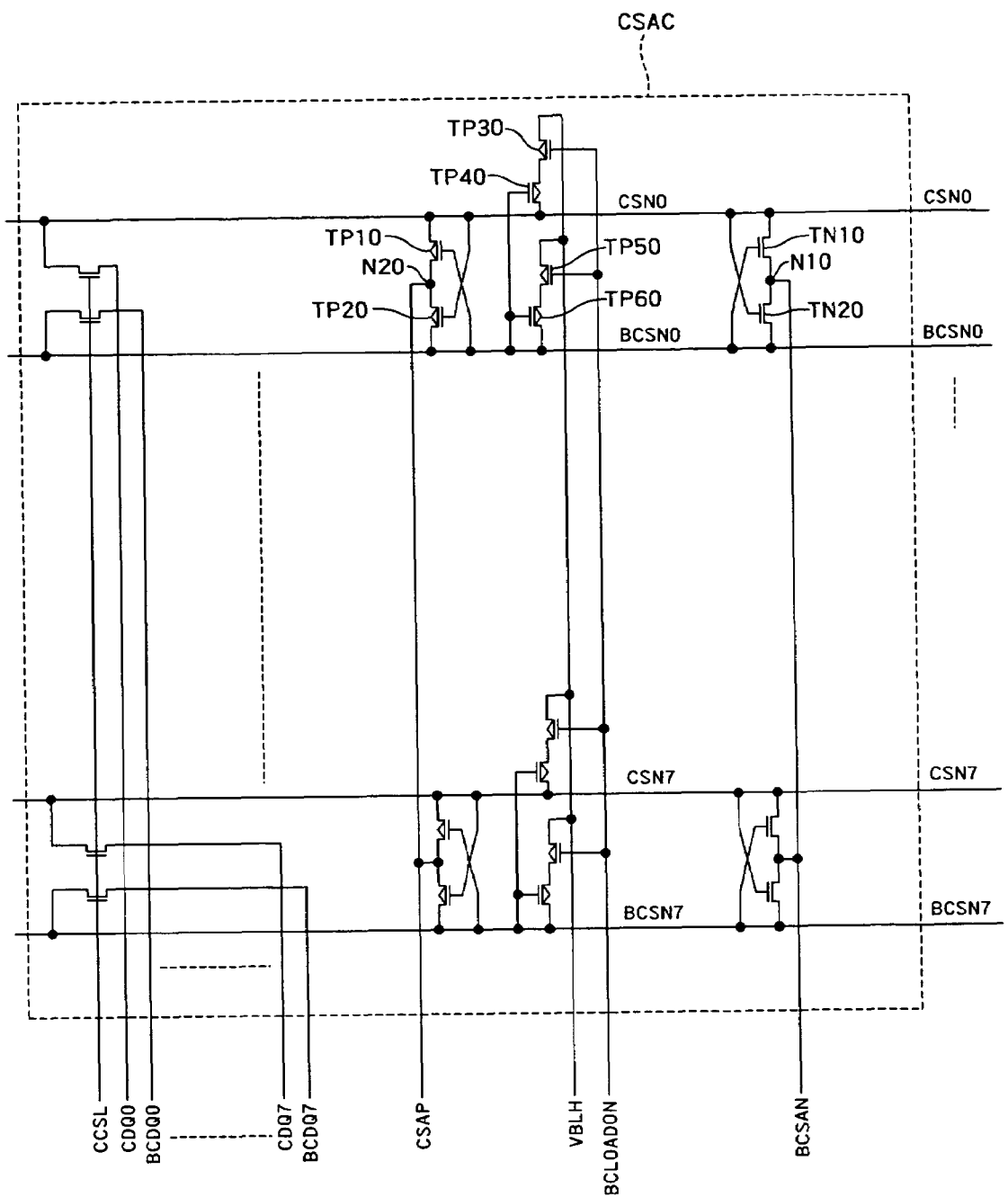
FIG. 6 is a circuit diagram showing an interior of a counter sense amplifier core CSAC shown in FIG. 5.

FIG. 6 is a circuit diagram showing an interior of a counter sense amplifier core CSAC shown in FIG. 5, in detail. The counter sense amplifier core CSAC shown in FIG. 5 is basically identical to the sense amplifier core SAC0 shown in FIG. 4. However, the counter sense amplifier core CSAC does not include the AND gates 20 and 40, nor the OR gate 30.

NMOS transistors TN10 and TN20 are connected in series between the sense nodes CSNi and BCSNi. A node N10 between the NMOS transistors TN10 and TN20 is connected to a signal line BCSAN. Gates of the transistors TN10 and TN20 are cross-coupled.

Likewise, PMOS transistors TP10 and TP20 are connected in series between the sense node CSNi and BCSNi. A node N20 between the PMOS transistors TP10 and TP20 is connected to a signal line CSAP. Gates of the transistors TP10 and TP20 are cross-coupled.

PMOS transistors TP30 and TP40 are connected in series between the high voltage source VBLH and the sense node CSN0. PMOS transistors TP50 and TP60 are connected in series between the high voltage source VBLH and the sense node BCSN0. Gates of the transistors TP30 and TP50 are connected to a signal line BCLOADON. Gates of the transistors TP40 and TP60 are connected to the sense node BCSN0 in common. Thus, the transistors TP30, TP40 and the transistors TP50, TP60 constitute a current-mirror between the sense nodes CSN0 and BCSN0.

Sense nodes CSN0 to CSN7 and BCSN0 to BCSN7 are connected to data input and output lines CDQ0 to CDQ7 and BCDQ0 to BCDQ7 through NMOSs, respectively. These NMOSs are controlled by a counter column select line CCSL.

Figure 7:
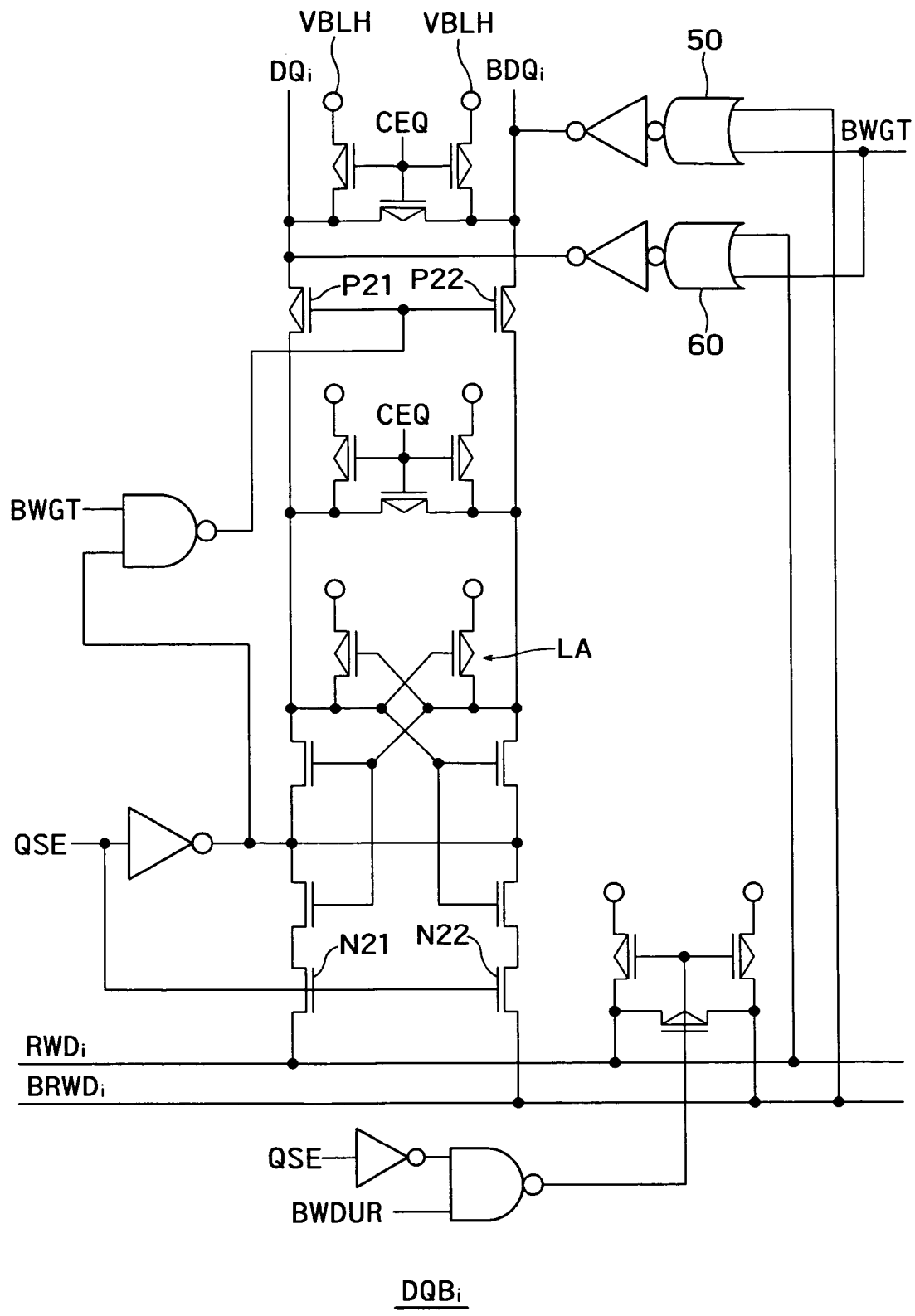
FIG. 7 is a circuit diagram showing the DQ buffer DQBi (where i=0 to 7) shown in FIG. 2.

FIG. 7 is a circuit diagram showing the DQ buffer DQBi (where i=0 to 7) shown in FIG. 2, in detail. If the DQ buffer DQBi is to read the data DQi and BDQi from the data sense amplifier DSA, a column equalizing signal CEQ is set HIGH. By setting so, the DQ buffer DQBi is disconnected from the high voltage source BVLH and transmits voltages according to the data DQi and BDQi. At this time, a signal BWGT is HIGH and a signal QSE is also HIGH. PMOS transistors P21 and P22 are turned off. The data DQi and BDQi is thereby stored in a latch LA and amplified therein. NMOS transistors N21 and N22 are turned on. The data DQi and BDQi amplified in the latch LA is read to read/write driving lines RWDi and BRWDi, respectively.

If the DQ buffer DQBi is to output the written data DQi and BDQi to the data sense amplifier DSA, the signal BWGT is set LOW. NOR gates 50 and 60 thereby output signals according to the read/write driving lines RWDi and BRWDi, respectively. The DQ buffer DQBi can output the data DQi and BDQi to the data sense amplifier DSA.

Figure 8:
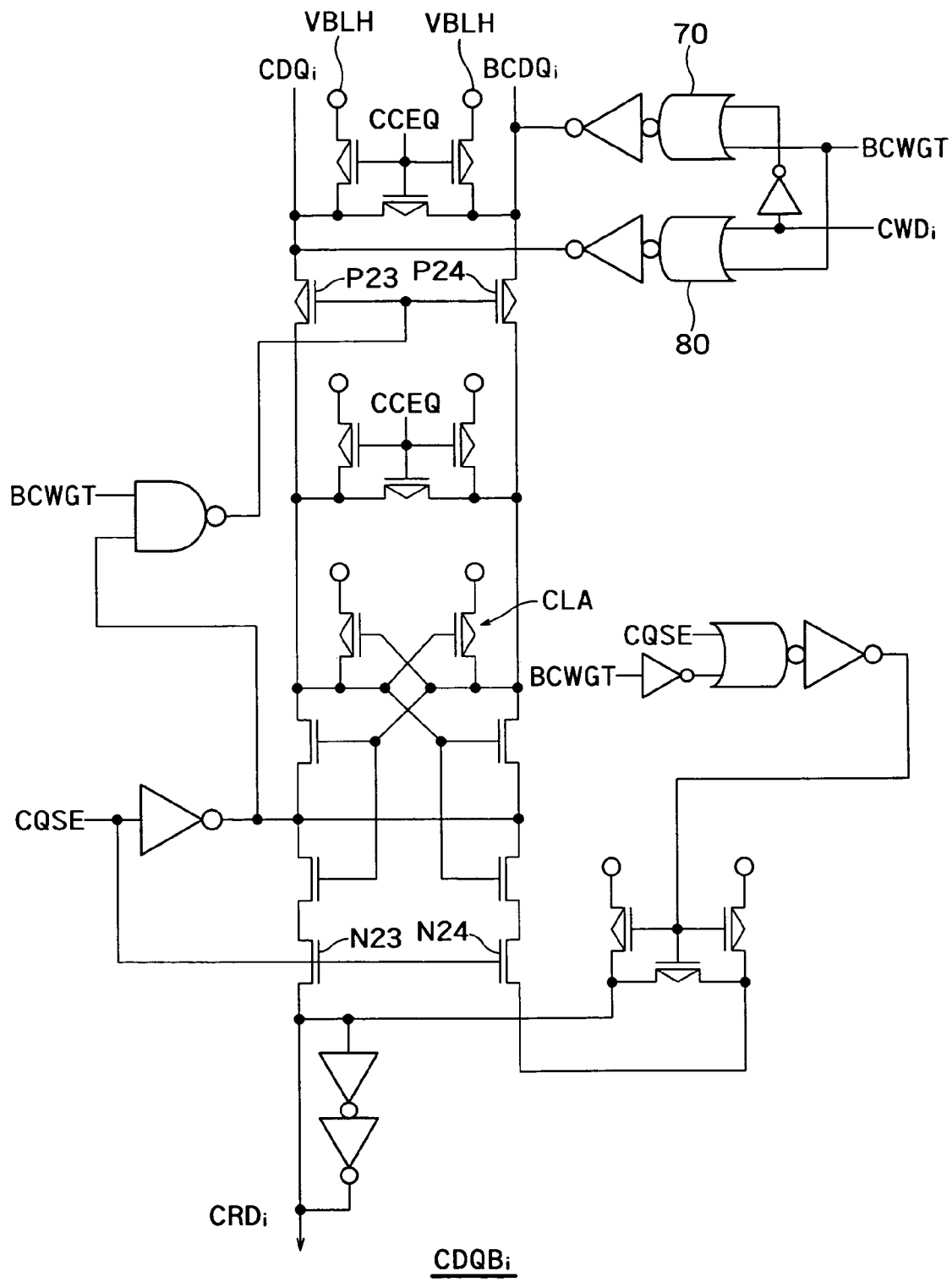
FIG. 8 is a circuit diagram showing the counter DQ buffer CDQBi shown in FIG. 2.

FIG. 8 is a circuit diagram showing the counter DQ buffer CDQBi (where i=0 to 7) shown in FIG. 2, in detail. If the counter DQ buffer CDQBi is to read the data CDQi and BCDQi on the numbers of times of activation from the counter sense amplifier CSA, a counter column equalizing signal CCEQ is set HIGH. The counter DQ buffer CDQBi is thereby disconnected from the high voltage source BVLH and transmits voltages according to the data CDQi and BCDQi, respectively. At this time, a signal BCWGT is HIGH and a signal CQSE is HIGH. PMOS transistors P23 and P24 are, therefore, turned off. The data CDQi and BCDQi is thereby stored and amplified in a latch portion CLA. NMOS transistors N23 and N24 are turned on. The data CDQi amplified in the latch portion CLA is thereby output, as counter read data CRDi, to the half adder HAi and the AND gate 10 (see FIG. 2).

A sum "S" of the half adder HAi is input, as counter write data CWDi, to the counter DQ buffer CDQBi. At this time, the signal BCWGT is set LOW. NOR gates 70 and 80 thereby output signals corresponding to the counter write data CWDi, respectively. The DQ buffer DQBi can thereby output the counter data CDQi and BCDQi to the data sense amplifier DSA.

Figure 9:
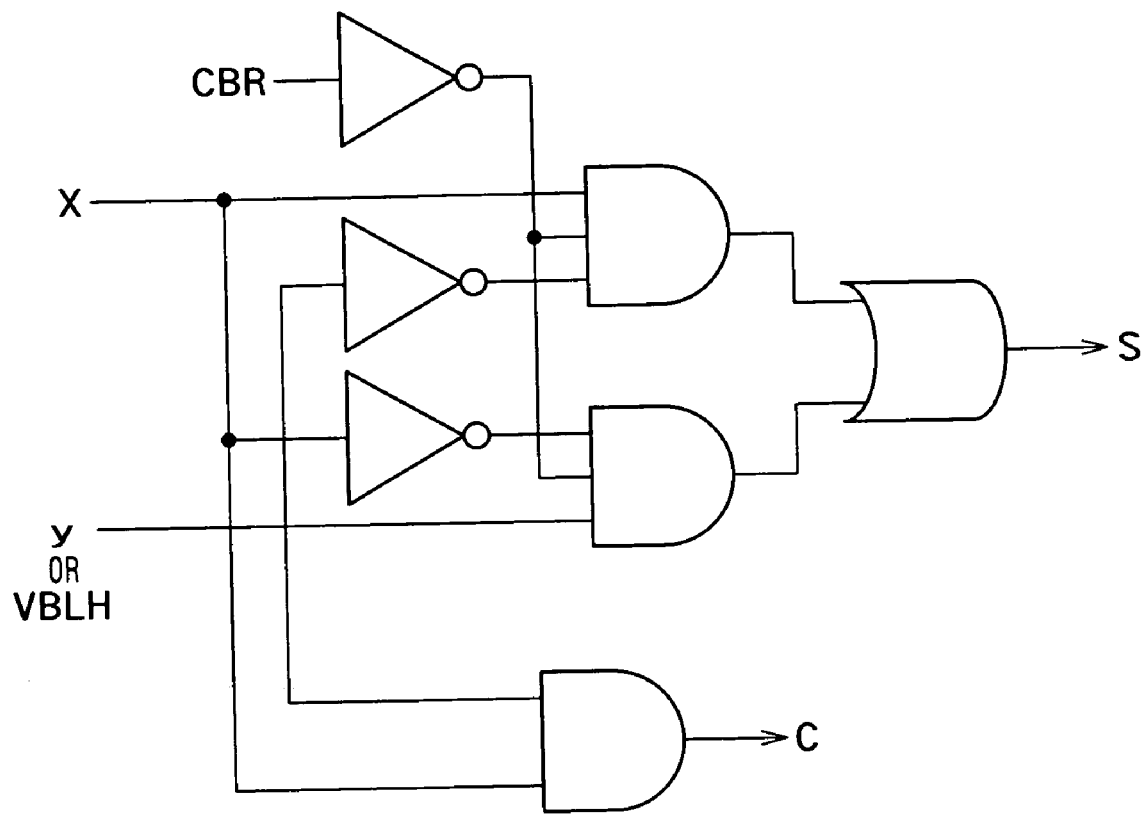
FIG. 9 is a circuit diagram showing an interior of the half adder HAi.

FIG. 9 is a circuit diagram showing an interior of the half adder HAi. In the normal refresh operation, the CAS before RAS signal CBR is raised to HIGH, so that the sum "S" is turned LOW. Namely, the half adder HAi outputs "00000000".

In a read/write operation, the signal CBR remains LOW. The half adder HAi, therefore, outputs the sum S that is a signal based on inputs x and y. The high voltage source VBLH is connected to the input y of the half adder HA0 corresponding to the least significant bit. The high voltage source VBLH increments the counter read data CRDi input from the input x by one. In the read/write operation, the half adder HAi (where i=0 to 7) returns the counter write data CWDi, which are obtained by incrementing the counter read data CRDi, to the counter DQ buffer CDQBi.

FIG. 10 is a circuit diagram showing interiors of the refresh controller 110, the RINT generator 120, and the refresh timer 130. The output CPMP of the AND gate 10 shown in FIG. 2 is inverted by a NAND gate 11. This inverted signal is transmitted, as a refresh request signal REFREQ, to a set/reset type flip-flop FF1 within the refresh controller 110. If the number of times of activation of the word line WLi is 0 to 255, the refresh request signal REFREQ is kept LOW. If the number reaches 256, the refresh request signal REFREQ rises from LOW to HIGH.

The refresh controller 110 will now be described. The refresh controller 110 includes the first set/reset type flip-flop FF1 configured by NAND gates 31 and 32, and a second set/reset type flip-flop FF2 configured by NAND gates 33 and 34.

A signal BPRST is a signal rising from LOW to HIGH when power is turned on, and kept HIGH thereafter. The signal BPRST causes an output node E of the NAND gate 31 to be set HIGH. In an initial state, the refresh request signal REFREQ is HIGH, so that an output node "A" of the NAND gate 32 is set LOW. An output node "B" of the NAND gate 35 is, therefore, set HIGH.

An external RAS signal REXT is a signal falling from HIGH to LOW during RAS precharge and kept LOW in the initial state. A signal REFTRAS is a signal obtained by delaying the refresh signal REFRESH and kept LOW in the initial state. An output node "G" of the NAND gate 36 is, therefore, set HIGH. After the power is turned on, if the external RAS signal REXT becomes HIGH even once, then an output node "C" of the NAND gate 34 is set LOW, and an output node "F" of the NAND gate 33 is set HIGH. In the initial state, therefore, the signal REFRESH is set LOW.

As long as the refresh request signal REFREQ is kept HIGH without change, the node "B" remains HIGH and does not output a LOW set pulse. The node "C", therefore, remains LOW and the signal REFRESH does not rise.

If the refresh request signal REFREQ falls from HIGH to LOW (the number of times of activation reaches 256), then the node "A" is turned HIGH and the node "E" is turned LOW. This state is latched by the flip-flop FF1. However, if this period is not the RAS precharge period, the external RAS signal REXT is kept HIGH. Therefore, the node "B" remains HIGH and the signal REFRESH remains LOW. If the period enters the RAS precharge period, the external RAS signal REXT falls to LOW. On this opportunity, the node "B" falls to LOW and the signal REFRESH rises LOW to HIGH. As a result, the extra refresh operation can be executed during the RAS precharge period.

As can be seen, the refresh controller 110 latches the change of the refresh request signal REFREQ, which indicates that the number of times of activation reaches a predetermined value, in the flip-flop FF1, and changes the refresh signal REFRESH according to this latched state at the timing based on the external RAS signal REXT.

The refresh timer 130 will be described. The refresh timer 130 includes a delay circuit Delay$\tau_3$. The refresh timer 130 outputs a delay signal REFTRAS obtained by delaying the refresh signal REFRESH by as much as a time $\tau_3$. The delay signal REFTRAS is fed back to the NAND gate 36.

If the refresh signal REFRESH rises from LOW to HIGH, then the RAS is activated and the extra refresh operation is started. Accordingly, the delay signal REFTRAS rises from LOW to HIGH by a delay by as much as the time $\tau_3$ from the refresh signal REFRESH. If the delay signal REFTRAS rises, the flip-flops FF1 and FF2 are reset to initial states. The refresh signal REFRESH thereby falls from HIGH to LOW, and the extra refresh operation is finished. The refresh timer 130 thus determines the end of the extra refresh operation.

The RINT generator 120 receives the refresh signal REFRESH and the external RAS signal REXT. The RINT generator 120 outputs the internal RAS signal RINT. The internal RAS signal RINT is transmitted to the word line controller WLC, the counter sense amplifier controller CSAC, and BSANi-SAPi-BLOADONi controller BSBC so as to execute the normal read/write operation and the normal refresh operation.

Figure 11:
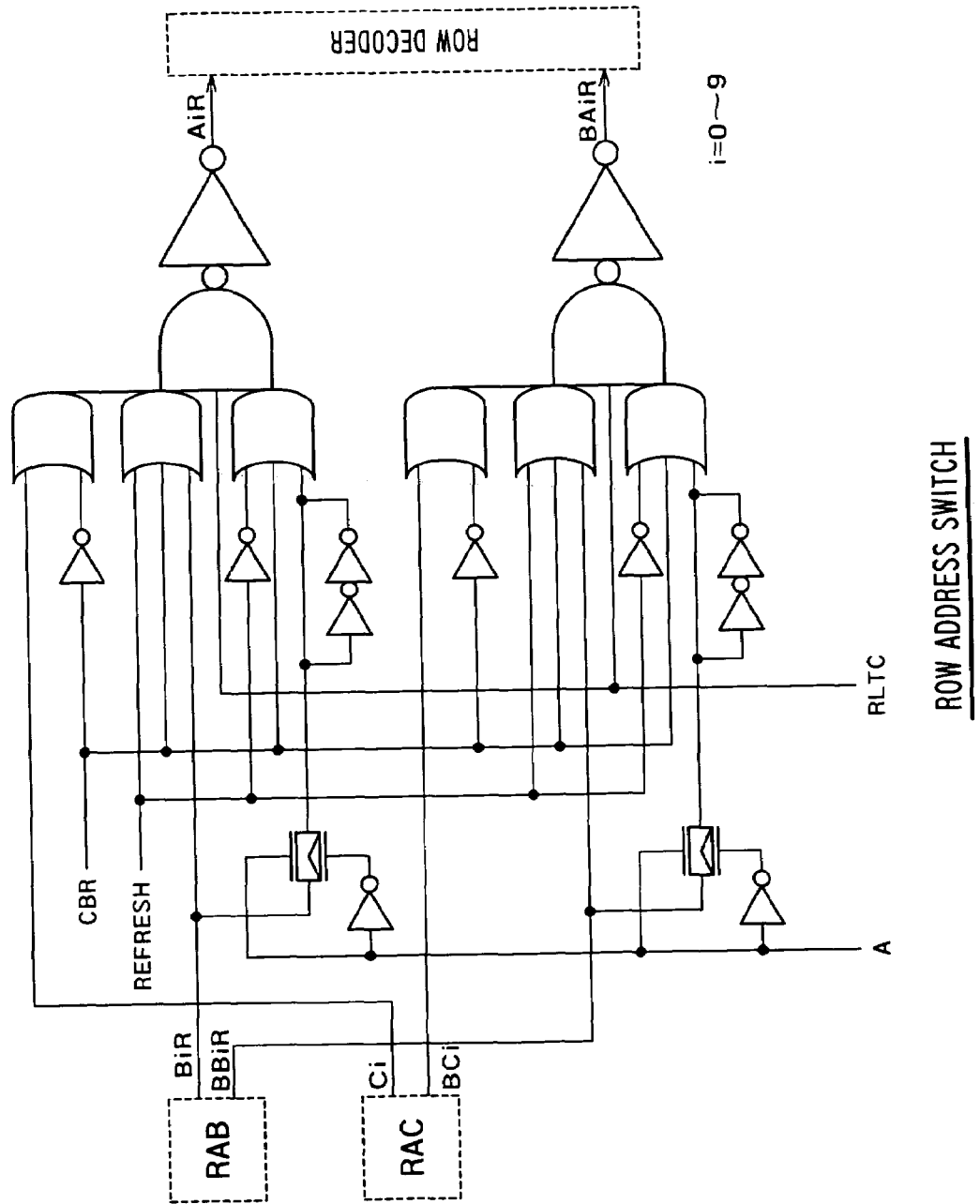
FIG. 11 is a circuit diagram showing an interior of the row address switch RASW.

FIG. 11 is a circuit diagram showing an interior of the row address switch RASW. The row address switch RASW inputs address signals BiR and BBiR from a row address buffer RAB and inputs address signals Ci and BCi from a row address counter RAC.

In the normal refresh operation, the signal CBR rises, so that the address signals Ci and BCi are transmitted as address signals AiR and BAiR to the row decoder. In the extra refresh operation, the signal REFRESH rises and the address signals BiR and BBiR selected in the read/write operation executed just before the extra refresh operation are transmitted as the address signals AiR and BAiR to the row decoder. In this case, the memory cells MC connected to the word line at the same address as the address selected in the read/write operation just before the extra refresh operation.

<Normal Refresh Operation>

Figure 12:
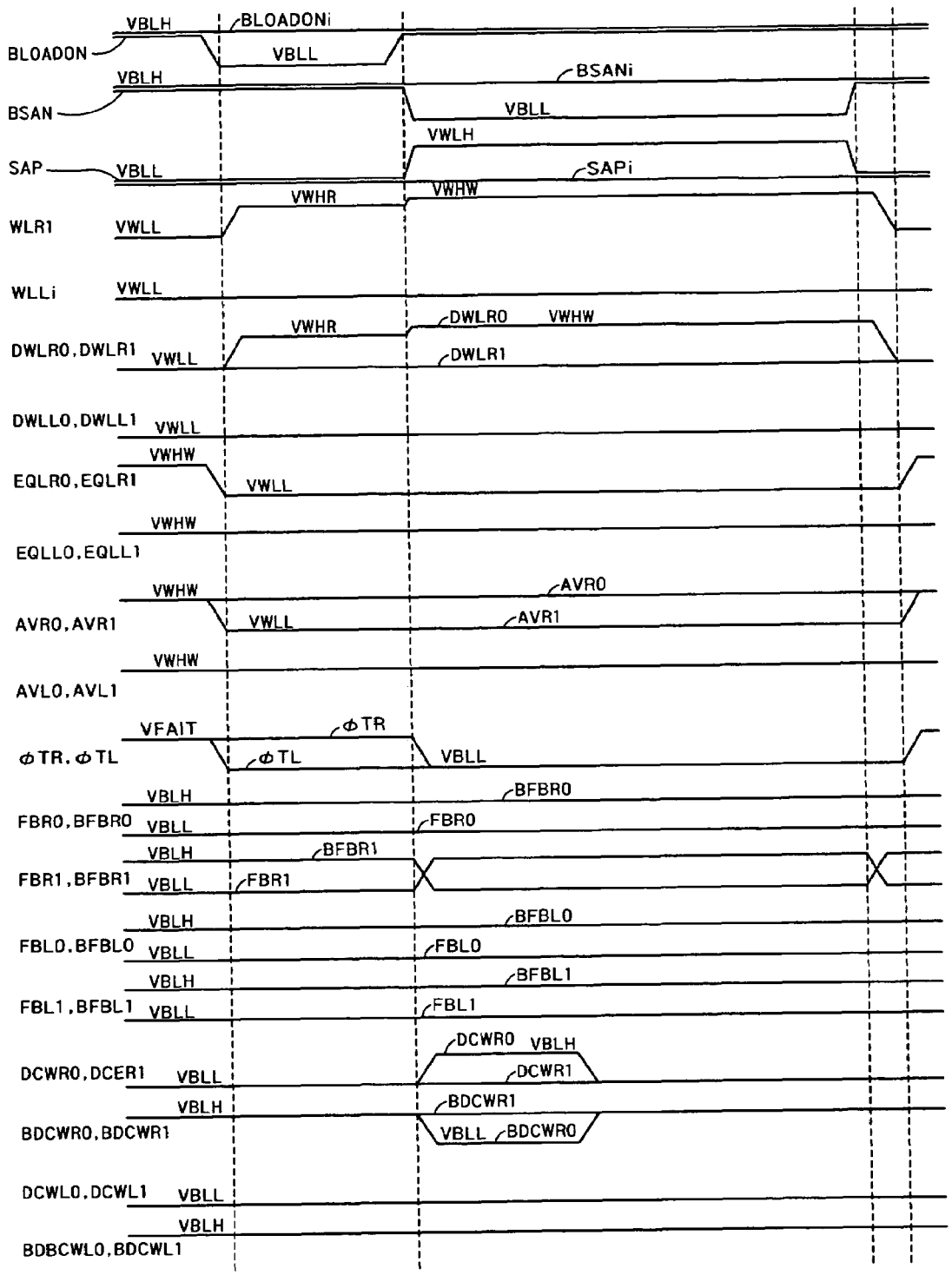
FIGS. 12 and 13 are timing chart of the semiconductor memory device 100 in the normal refresh operation.
Figure 13:
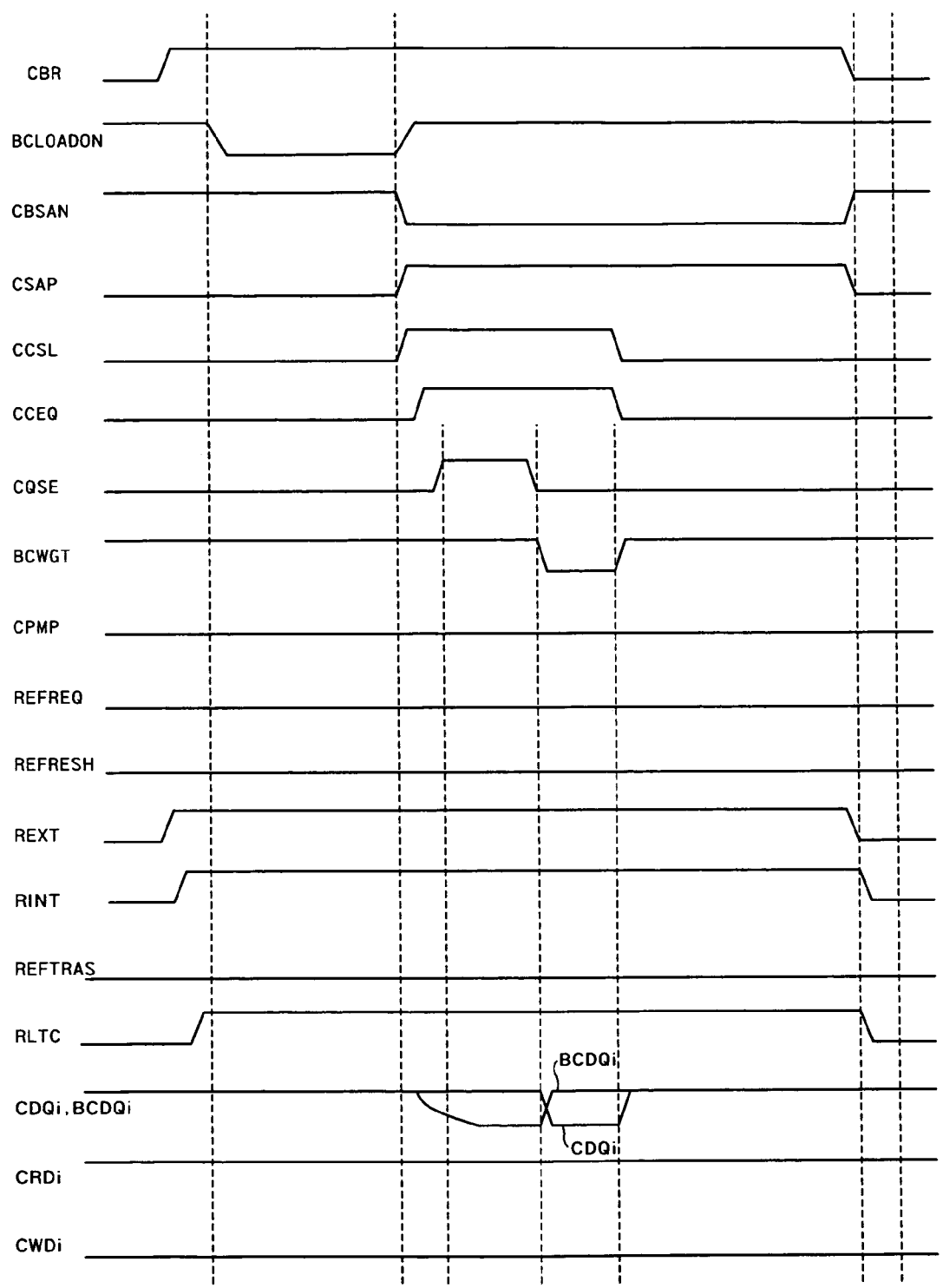

FIGS. 12 and 13 are timing chart of the semiconductor memory device 100 in the normal refresh operation. FIG. 12 is a timing chart of signals related to the data sense amplifier DSA, and FIG. 13 is a timing chart of signals related to the counter sense amplifier CSA.

The normal refresh operation is started when the CAS before RAS signal (FIG. 13) rises to HIGH. The CAS before RAS signal CBR is a signal activated when a signal BCAS falls to LOW before a signal BRAS falls to LOW. The signal CBR is an input that is not activated in the normal read/write operation and the extra refresh operation. In response to this signal CBR, the semiconductor memory device 100 refreshes the memory cells connected to the word line corresponding to the address of the row address counter.

In the normal refresh operation, all the word lines are equally refreshes in order irrespective of the numbers of times of word lines. This is one of differences of the normal refresh operation from the extra refresh operation. The refresh operation is an operation for temporarily reading the data stored in memory cells MC, latching this data, and rewriting the data to the same memory cells MC, respectively.

As shown in FIG. 12, in the data sense amplifier DSA, the signals BLOADONi, BSANi, and SAPi are all inactive whereas the signals BLOADON, BSAN, and SAP are active. The "active (activated)" means a state in which a non-inverted signal (without a letter B (bar) at the top of a reference symbol) is HIGH and in which an inverted signal (with a letter B (bar) at the top of a reference symbol) is LOW. The "inactive" means a state in which a signal level is opposite to an active signal level. At this time, therefore, the signals BLOADONi and BSANi are HIGH and the signal SAPi is LOW. The signals BLOADON and BSAN are LOW and the signal SAP is HIGH. In this case, referring to FIG. 4, it is understood that the AND gate 40 outputs LOW, the AND gate 20 outputs LOW, and that the OR gate 30 outputs HIGH. This operation is common to all the sub data sense amplifiers SDSA0 to SDSA127 within the data sense amplifier DSA. As a result, all the memory cells MC connected to the selected word line WLLi are refreshed. The number of memory cells MC refreshed simultaneously according to this embodiment is more than that according to the conventional technique. A busy rate of the refresh operation is advantageously lower.

As shown in FIG. 13, in the counter sense amplifier CSA, the counter column select line CCSL rises, data is read from the counter cells CC in response to the signals CCEQ, CQSE, and BCWGT, and data obtained by incrementing this data is written back to the counter cells CC, respectively. At this time, the signal CBR is HIGH. Therefore, as described with reference to FIG. 9, the half adder HAi outputs "00000000" irrespective of the data read from the counter cells CC. Namely, all the data of the counter cells CC connected to the selected word line WLj are initialized to 0. The "zero (0)" means a logic value on the DQ line. Therefore, the data "0" is written to the counter cells CC connected to the BCLLi or BCLRi during data write whereas the data "1" is written to the counter cells CC connected to the CLLi or CLRi during data read.

<Read/Write Operation>

Figure 14:
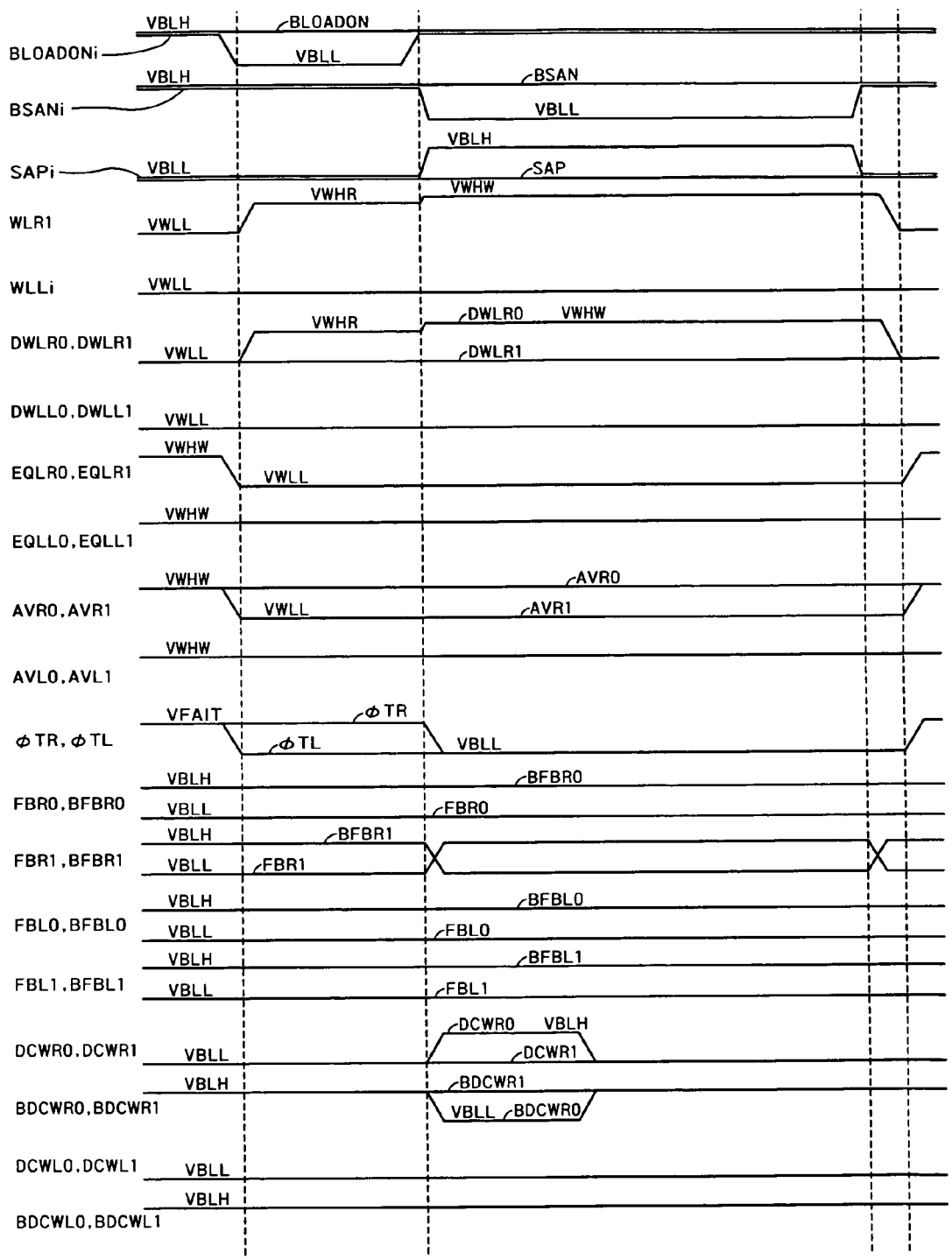
FIGS. 14 and 15 are timing charts of the semiconductor memory device 100 in the read and write operation.
Figure 15:
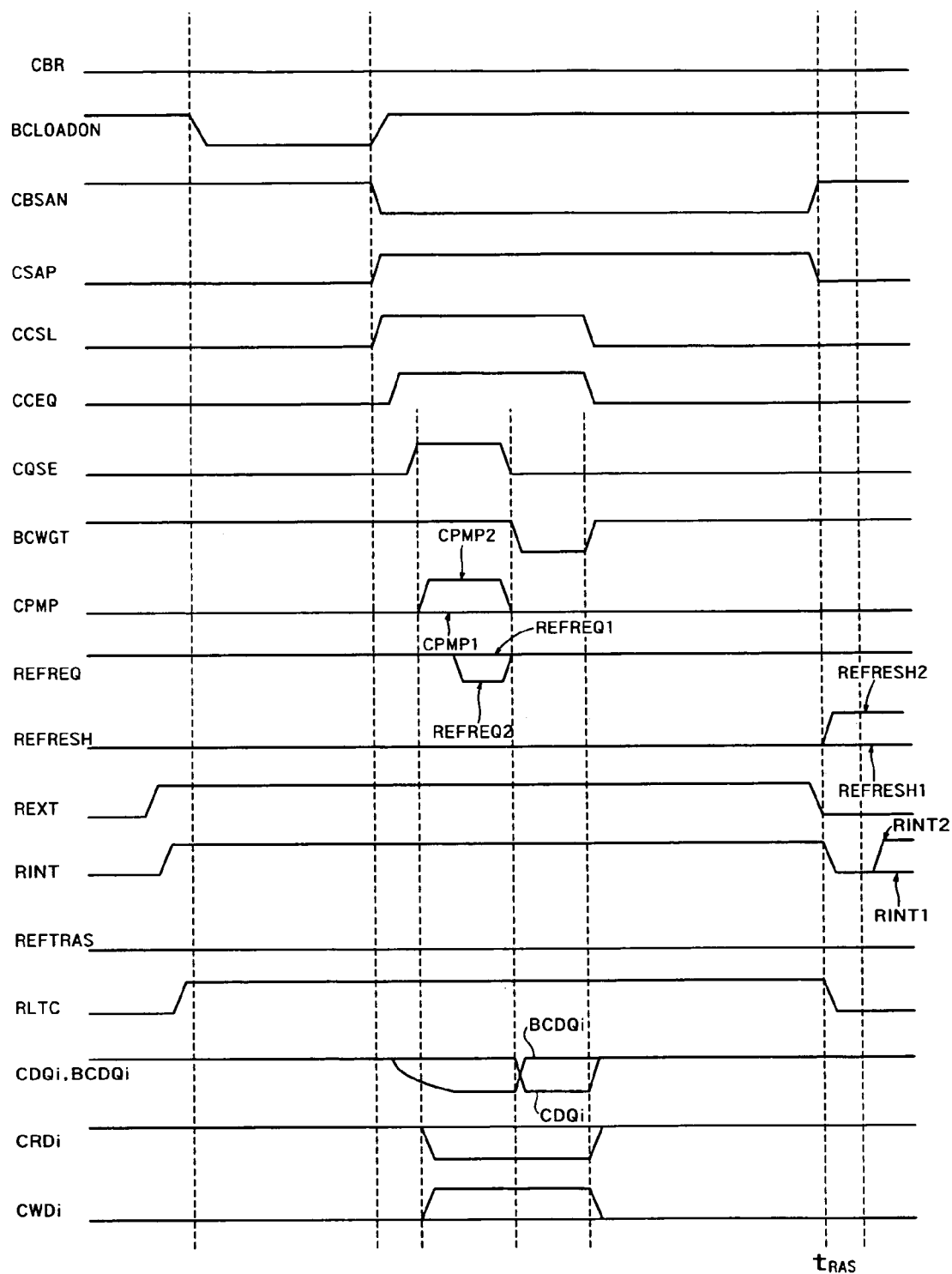

FIGS. 14 and 15 are timing charts of the semiconductor memory device 100 in the read and write operation. FIG. 14 is a timing chart of signals related to the data sense amplifier DSA and FIG. 15 is a timing chart of signals related to the counter sense amplifier CSA.

In the read/write operation, the CAS before RAS signal CBR is kept LOW. In addition, the signals BLOADON, BSAN, and SAP extending in the row direction are inactive. On the other hand, only selected signals BLOADONi, BSANi, and SAPi among signals BLOADON0 to BLOADON127, BSA0 to BSAN127, and SAP0 to SAP127 are activated. Selection information held by the signals BLOADONi, BSANi, and SAPi at this time indicates that only a certain sub data sense amplifier SDSAi is selected. The signals BLOADONi, BSANi, and SAPi are signals corresponding to the column select line CSLi rising to HIGH. Only the sub data sense amplifier SDSAi operates among the sub data sense amplifiers SDSA0 to SDSA127. The sub data sense amplifier SDSAi reads data from eight memory cells MC connected to eight bit lines or writes data to these memory cells MC.

In the counter sense amplifier CSA, eight-bit data of the eight counter cells CC connected to the selected word line WLj is read. The eight-bit data is latched by the counter DQ buffers CDQB0 to CDQB7 shown in FIG. 2 or 10. This eight-bit data is output to the half adders HA0 to HA7 and also output to the AND gate 10. The half adders HA0 to HA7 increment this eight-bit data (that is, add one to the eight-bit data). The half adders HA0 to HA7 return the incremented data to the counter DQ buffers CDQB0 to CDQB7, respectively. The AND gate 10 outputs, as the signal CPMP, the AND of the respective bits of the eight-bit data.

If the outputs of the counter DQ buffers CDQB0 to CDQB7 are less than "11111111" (if the number of times of activation of the word line WLj is less than 256), the extra refresh operation is not executed. If so, the signals CPMP, REFREQ, REFRESH, and RINT operate as signals CPMP1, REFREQ1, REFRESH1, and RINT 1 shown in FIG. 15 operate, respectively. Since the signals CPMP and REFREQ do not change, the flip flop FF1 in FIG. 10 maintains the initial state. Therefore, when the signal REXT is set LOW (at a timing $t_{RAS}$), the refresh signal REFRESH does not change even after the RAS precharge is started. In this case, the semiconductor memory device 100 only increments the eight-bit data and writes back the incremented data to the counter cells CC, and circuits downstream of the signal CPMP shown in FIG. 10 do not operate.

On the other hand, if the outputs of the counter DQ buffers CDQB0 to CDQB7 are "11111111" (the number of times of activation of the word line WLj reaches 256), the extra refresh operation is executed. At this time, the signals CPMP, REFREQ, REFRESH, and RINT operate as signals CPMP2, REFREQ2, REFRESH2, and RINT2 shown in FIG. 15 operate, respectively. The signal REFREQ changes from HIGH to LOW during data read. The signal change is latched by the flip-flop FF1 shown in FIG. 10. When the RAS precharge is started (at the timing $t_{RAS}$), therefore, the refresh signal REFRESH rises to HIGH.

The half adders HA0 to HA7 return "00000000" obtained by incrementing "11111111" to the counter DQ buffers CDQB0 to CDQB7, respectively. The number of times of activating the word line WLj can be, therefore, returned to the initial value.

In the conventional DRAM, all of 1024 sense amplifiers are activated every read or write operation. Therefore, current is consumed to charge the 1024 bit lines. According to this embodiment, by contrast, only one sub data sense amplifier SDSAi is activated and it suffices to charge the eight bit lines corresponding to the sub data sense amplifier SDSAi. Most of the current consumed in the memory cell array is the current for charging the bit lines. Considering this, the current consumption of the semiconductor memory device 100 according to this embodiment can be reduced to ⅟₁₂₈ of that of the conventional DRAM.

Furthermore, the DRAM cell is a destructive read-out cell. In the DRAM, therefore, data read from cells connected to the activated word line must be written back to the cells. Otherwise, the data are destroyed.

The FBC memory cell is, by contrast, a quasi non-destructed read-out cell. Therefore, the memory cells MC can hold data without writing back data to the cells connected to the activated word line after reading the data with each cycle. Therefore, no problem occurs even if only a part of the sub data sense amplifiers SDSi is activated as stated above.

This operation is possible on premise that the column address is input simultaneously with the row address for the following reasons. To select one sub data sense amplifier from the 128 sub data sense amplifiers, it is necessary to input the column address, and the column address should be input substantially simultaneously with input of the row address for selecting the word line.

(Extra Refresh Operation)

Figure 16:
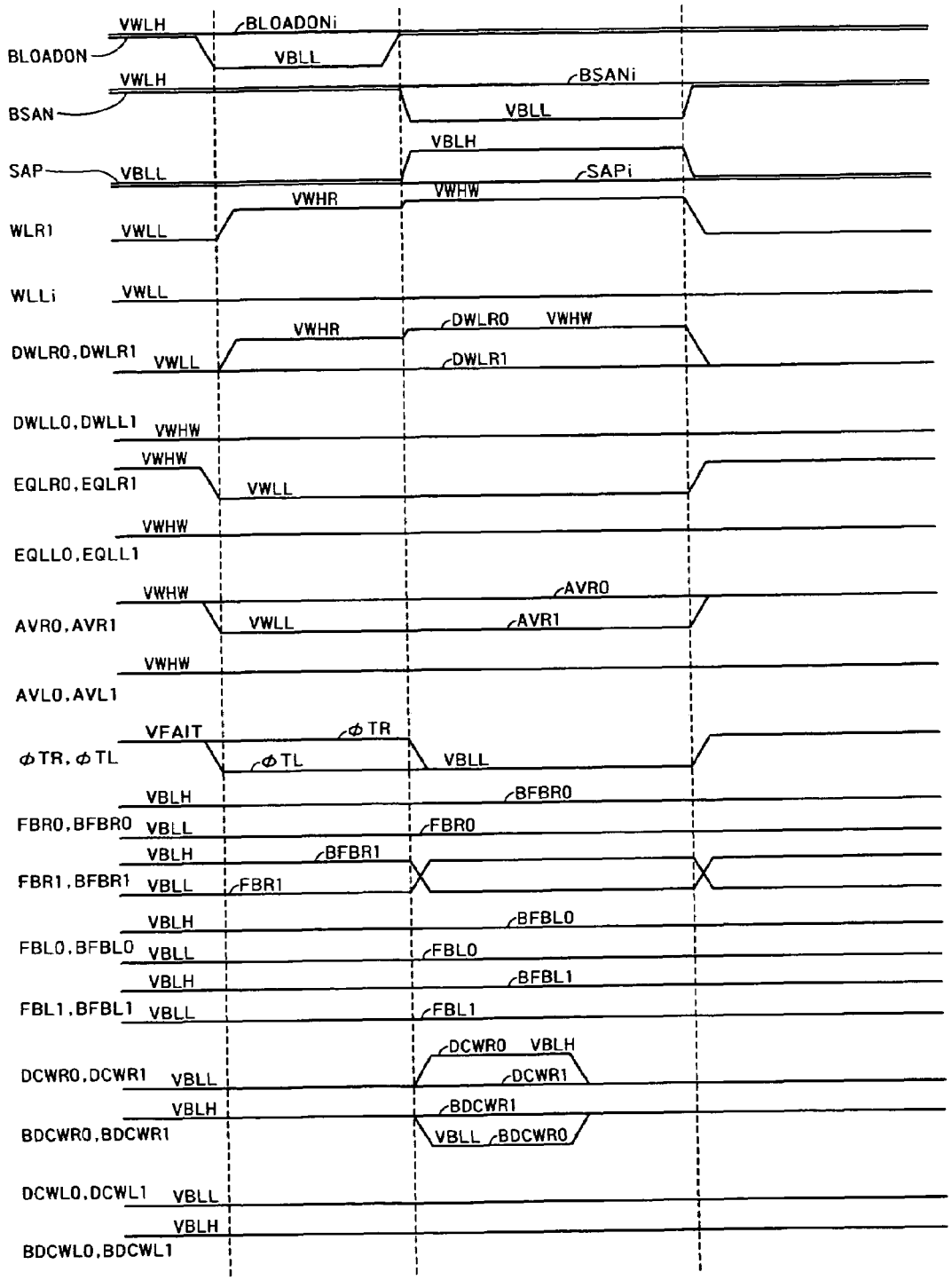
FIGS. 16 and 17 are timing charts of the semiconductor memory device 100 in the extra refresh operation.
Figure 17:
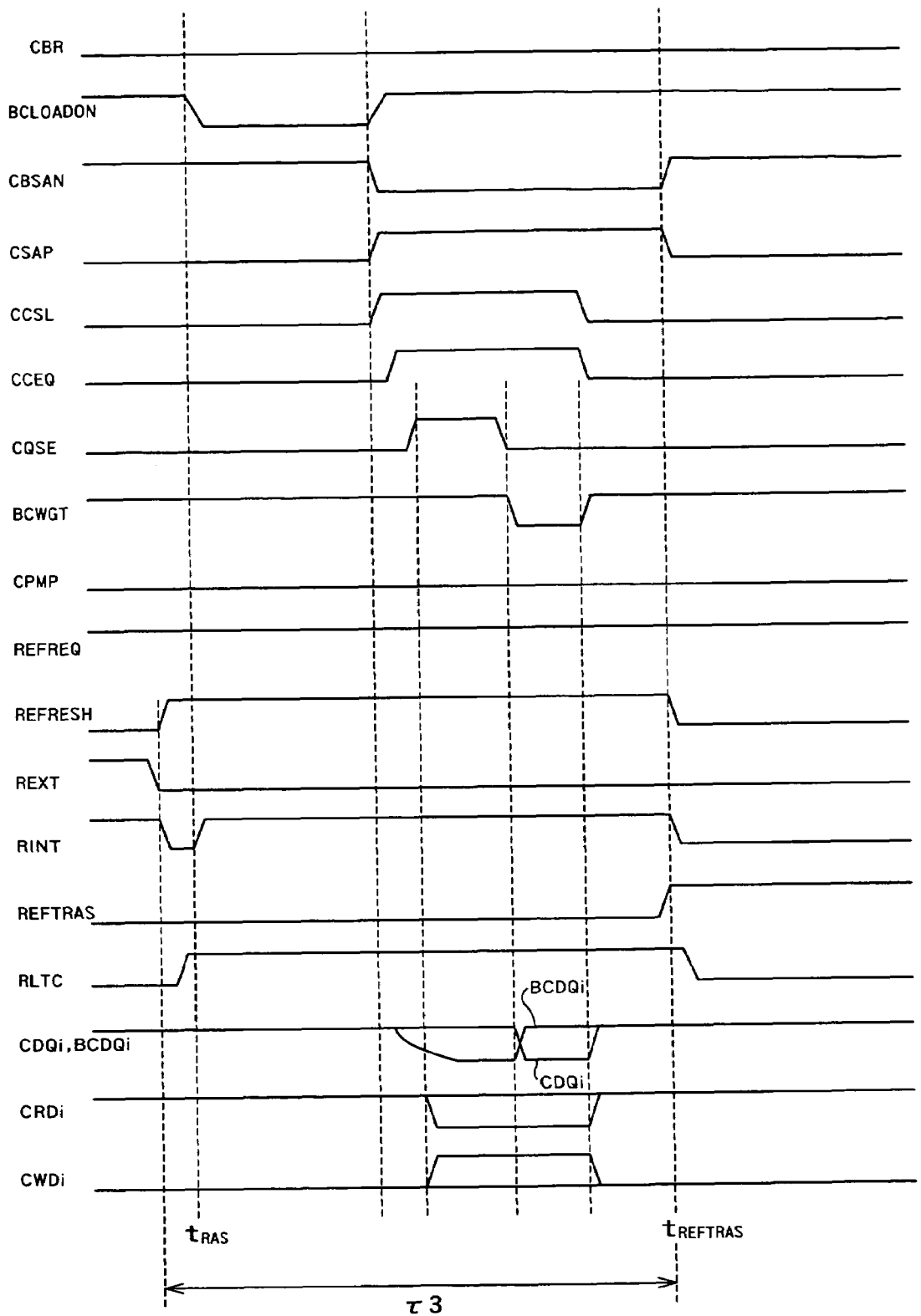

FIGS. 16 and 17 are timing charts of the semiconductor memory device 100 in the extra refresh operation. FIG. 16 is a timing chart of signals related to the data sense amplifier DSA, and FIG. 17 is a timing chart of signals related to the counter sense amplifier CSA. Since the opportunity for starting the extra refresh operation is already described with reference to FIG. 15, it will not be described herein.

In the extra refresh operation, the CAS before RAS signal CBR is kept LOW. After the timing $t_{RAS}$, the same operation as the normal refresh operation is executed during the RAS precharge period. However, the extra refresh operation is executed on only the memory cells connected the activated word line. At a timing $t_{REFTRAS}$ at which the delay signal REFTRAS rises to HIGH, the extra refresh operation is finished. As can be seen, the extra refresh operation is automatically finished by the delay time $\tau_3$ of the refresh timer 130.

First Modifications of First Embodiment

Figure 18:
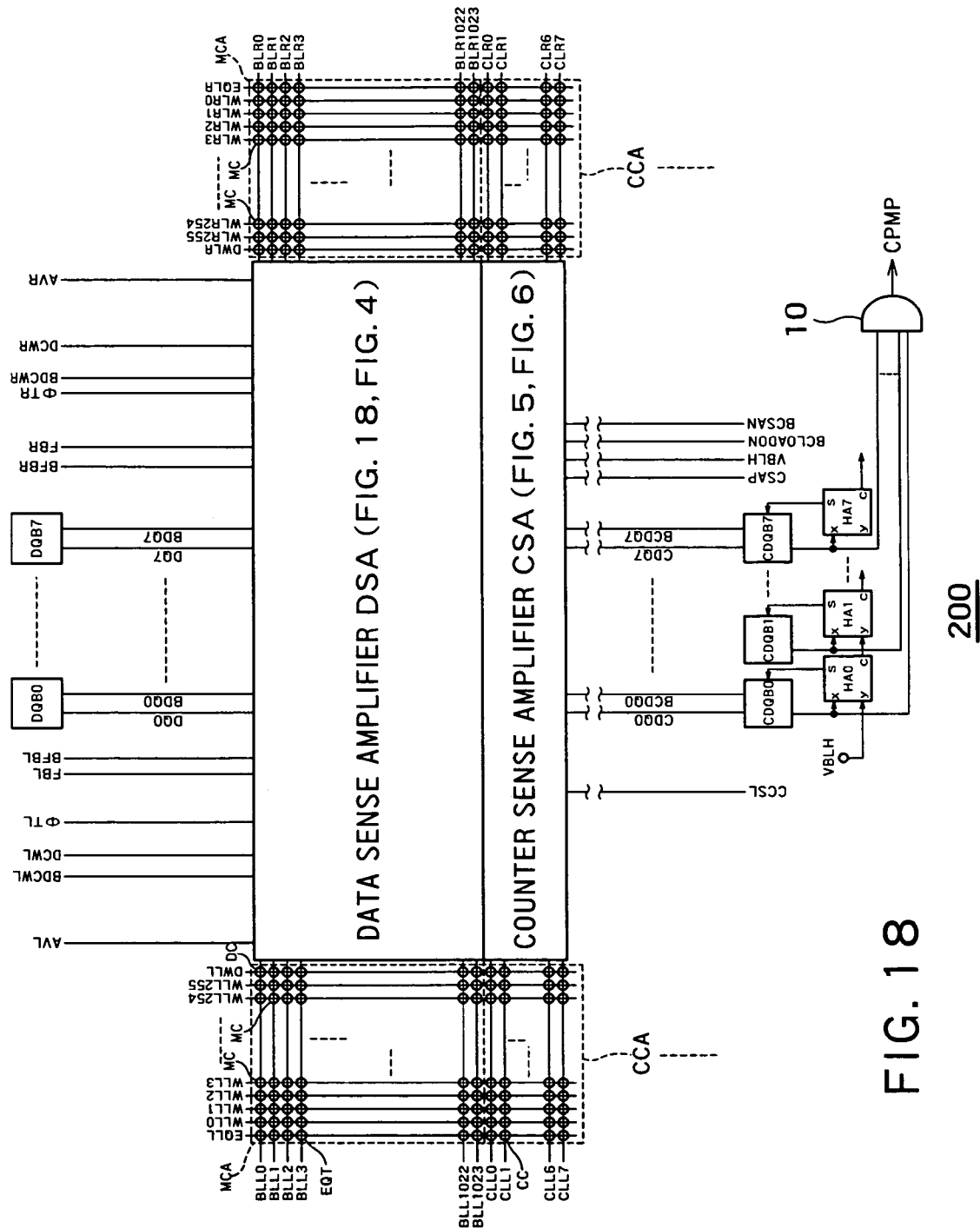
FIGS. 18 and 19 are circuit diagrams of a semiconductor memory device 200 according to a first modification of the first embodiment.
Figure 19:
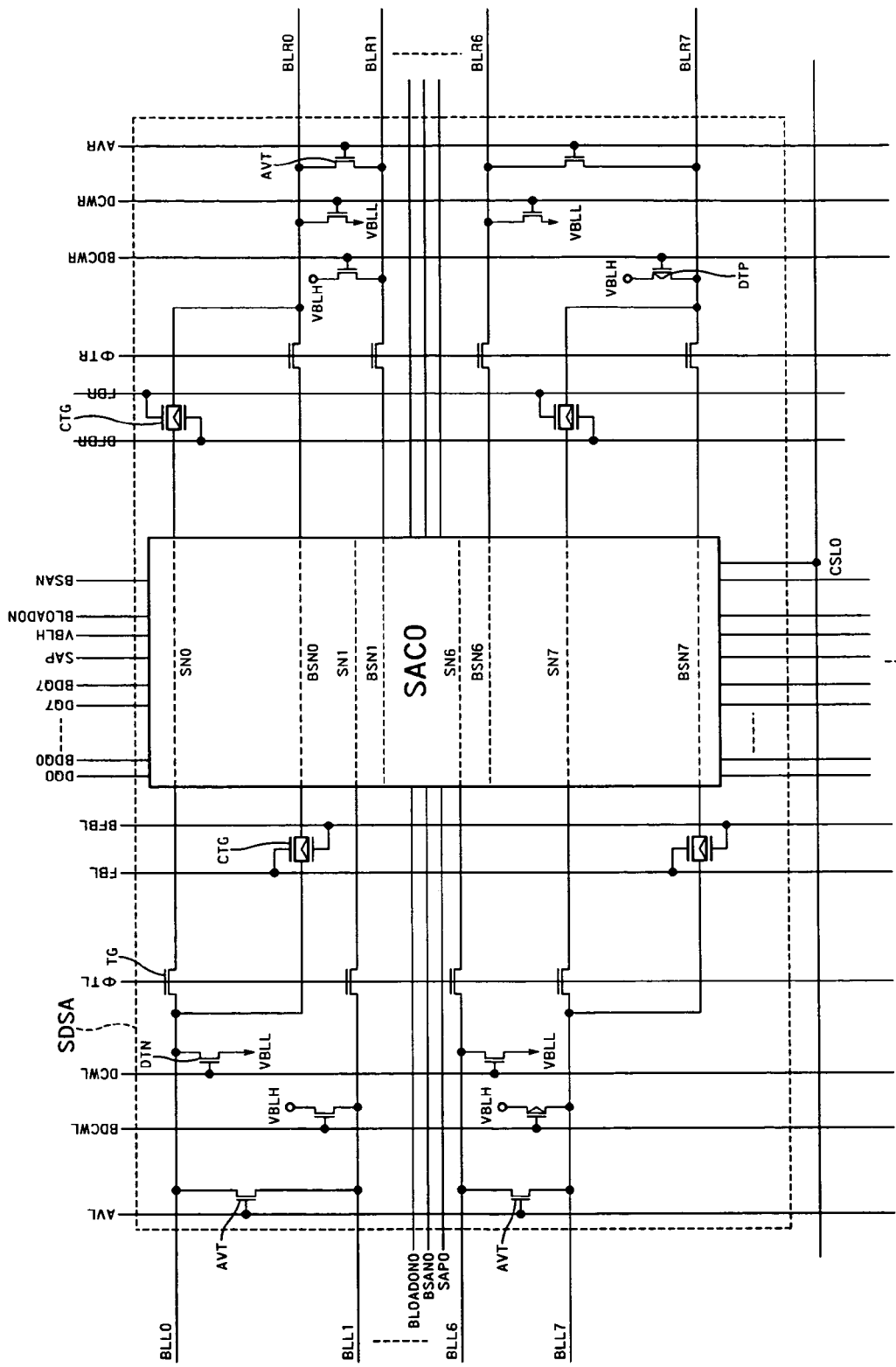

FIGS. 18 and 19 are circuit diagrams of a semiconductor memory device 200 according to a first modification of the first embodiment. The semiconductor memory device 200 differs from the semiconductor memory device 100 in that the memory 200 has an open bit line configuration. In this modification, therefore, memory cells MC are provided at all intersecting points between word lines and bit lines, respectively. Likewise, counter cells CC are provided at all intersecting points between the word lines and counter bit lines, respectively. Bit lines BBLL0 to BBLL1023 are not provided.

Since a configuration of a sense amplifier core SAC0 is the same as that shown in FIG. 4, it will not be described herein. Since a configuration of the counter sense amplifier CSA is the same as that shown in FIG. 6 and operations performed by the counter sense amplifier CSA are the same as those shown in FIGS. 13, 15, and 17, they will not be described herein. In addition, since circuits downstream of the output signal CPMP of the AND gate 10 are the same as those according to the first embodiment, they will not be described herein, either.

The semiconductor memory device 200 according to the first modification includes the sense amplifier core SAC0 and the counter sense amplifier CSA similarly to the first embodiment. Accordingly, the semiconductor memory device 200 according to the first modification exhibits the same advantages as those according to the first embodiment although the memory 200 has the open bit line configuration.

Second Modification of First Embodiment

Figure 20:
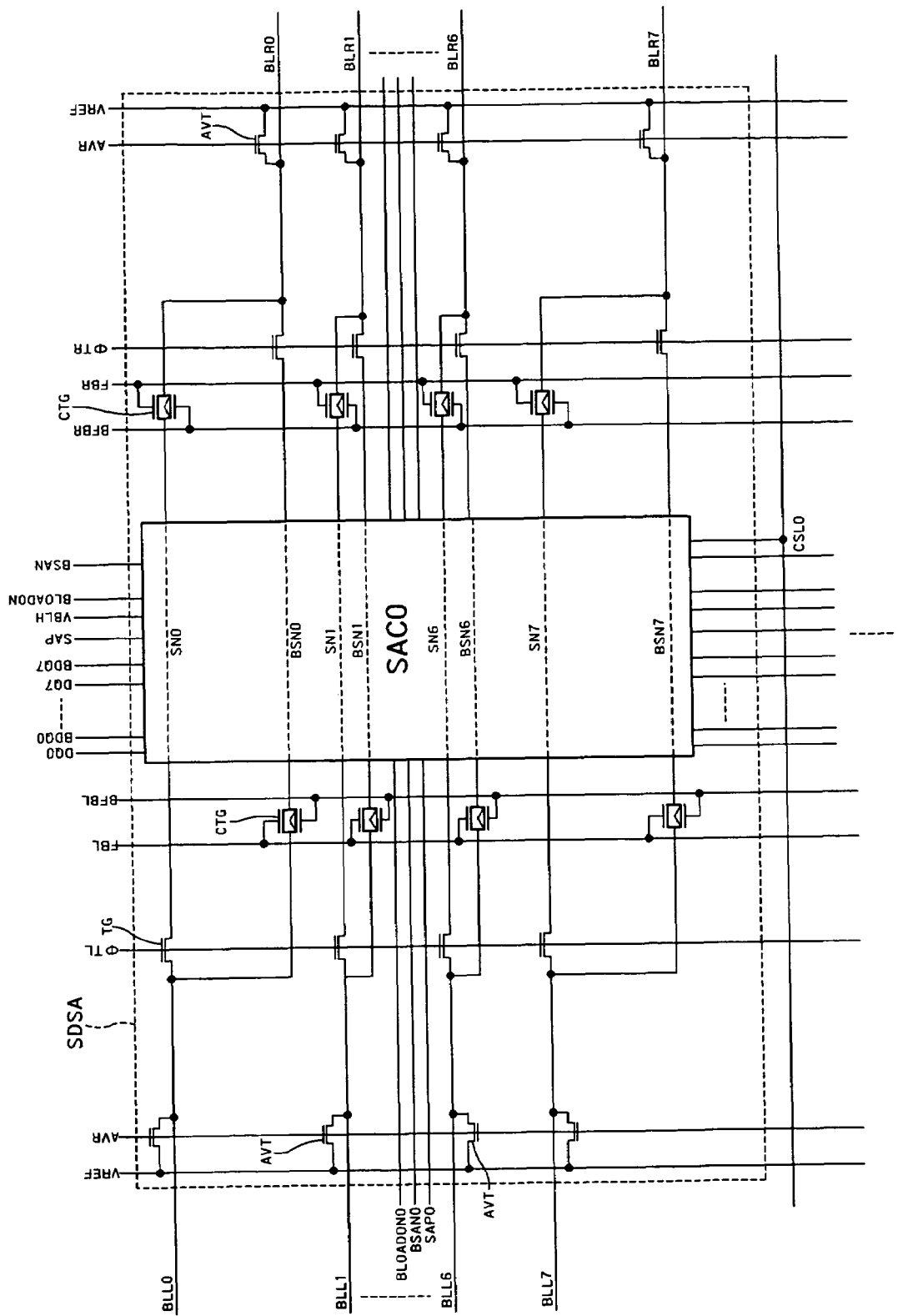
FIG. 20 is a circuit diagram of the sub data sense amplifier SDSA of a semiconductor memory device 300 according to a second modification of the first embodiment.

FIG. 20 is a circuit diagram of the sub data sense amplifier SDSA of a semiconductor memory device 300 according to a second modification of the first embodiment. According to the second modification, dummy cells and signal lines DCWL, BDCWL related to the dummy cells are not provided, and a reference signal is acquired from a power supply VREF. The averaging transistor AVT is provided between the power supply VREF and each bit line BLLi. Other constituent elements of the semiconductor memory device 200 in the second modification may be the same as those in the first modification. The second modification can, therefore, exhibit the same advantages as those of the first modification.

Third Modification of First Embodiment

Figure 21:
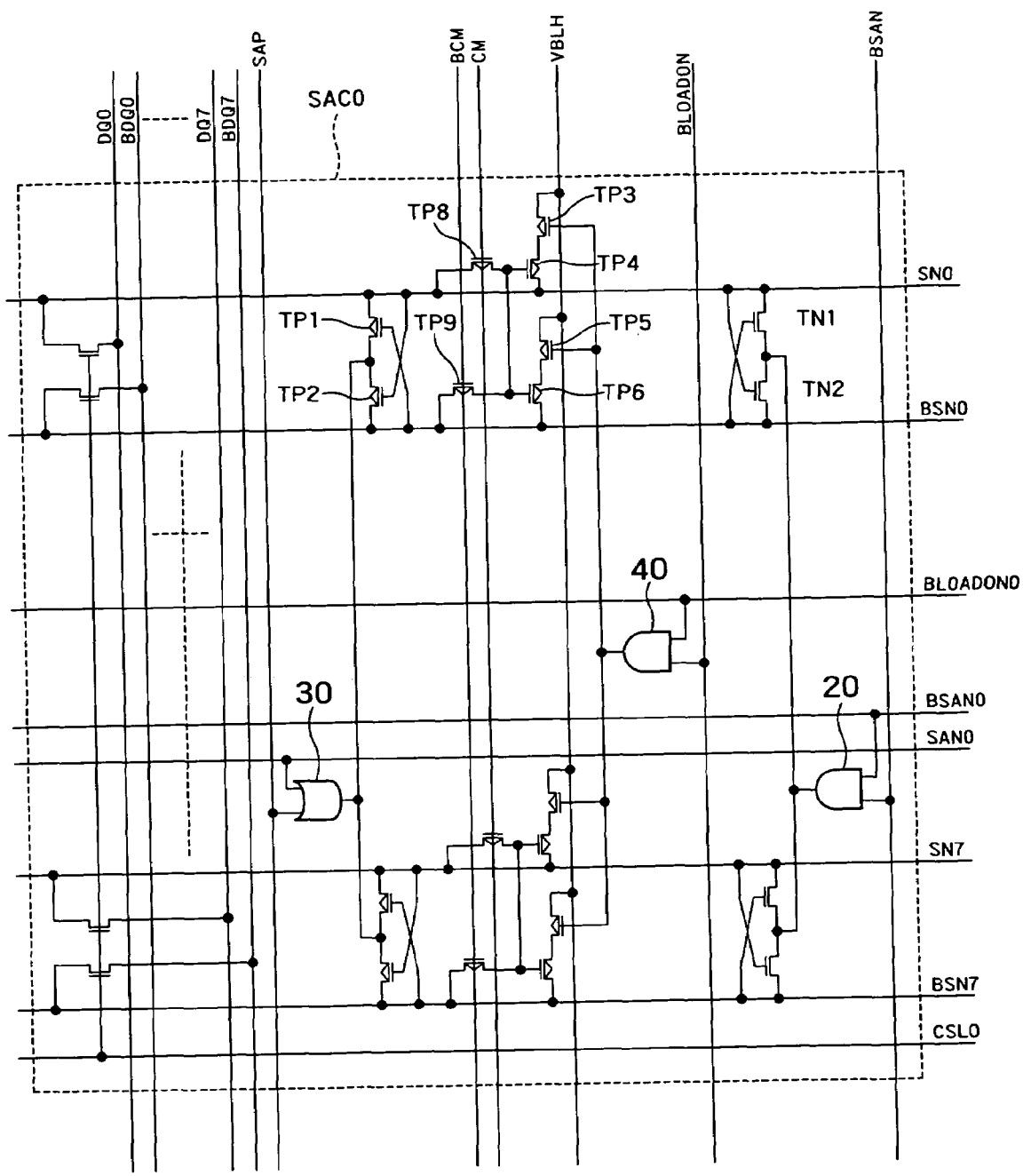
FIG. 21 is a circuit diagram of the sense amplifier core SAC0 of a semiconductor memory device according to a third modification of the first embodiment.

FIG. 21 is a circuit diagram of the sense amplifier core SAC0 of a semiconductor memory device according to a third modification of the first embodiment. In the third modification, a PMOS transistor TP8 is connected between the gate of the PMOS transistor TP4 and the sense node SN0. A PMOS transistor TP9 is connected between the gate of the PMOS transistor TP6 and the sense node BSN0. The transistor TP8 is controlled by a current-mirror signal CM, and the transistor TP9 is controlled by a current-mirror signal BCM. Other constituent elements of the semiconductor memory device according to the third modification may be the same as those according to the first embodiment.

Operations according to the third modification differ from those according to the first embodiment in the following respects. If the memory cell MC is connected to the sense node SNi and the dummy memory cell DMC is connected to the sense node BSNi, then the signal CM is HIGH and the signal BCM is LOW. The potential of the sense node BSNi, therefore, serves a reference potential of the current-mirror circuit. Further, the dummy memory cell DMC is connected to the sense node SNi and the memory cell MC is connected to the sense node BSNi, then the signal BCM is HIGH and the signal CM is LOW. The potential of the sense node SNi, therefore, serves as a reference potential of the current-mirror circuit. With such a configuration, the data sense amplifier DSA can detect data more stably.

The third modification can be combined with either the first modification or the second modification. In addition, the third modification can be applied to a second embodiment, to be described later.

SECOND EMBODIMENT

Figure 22:
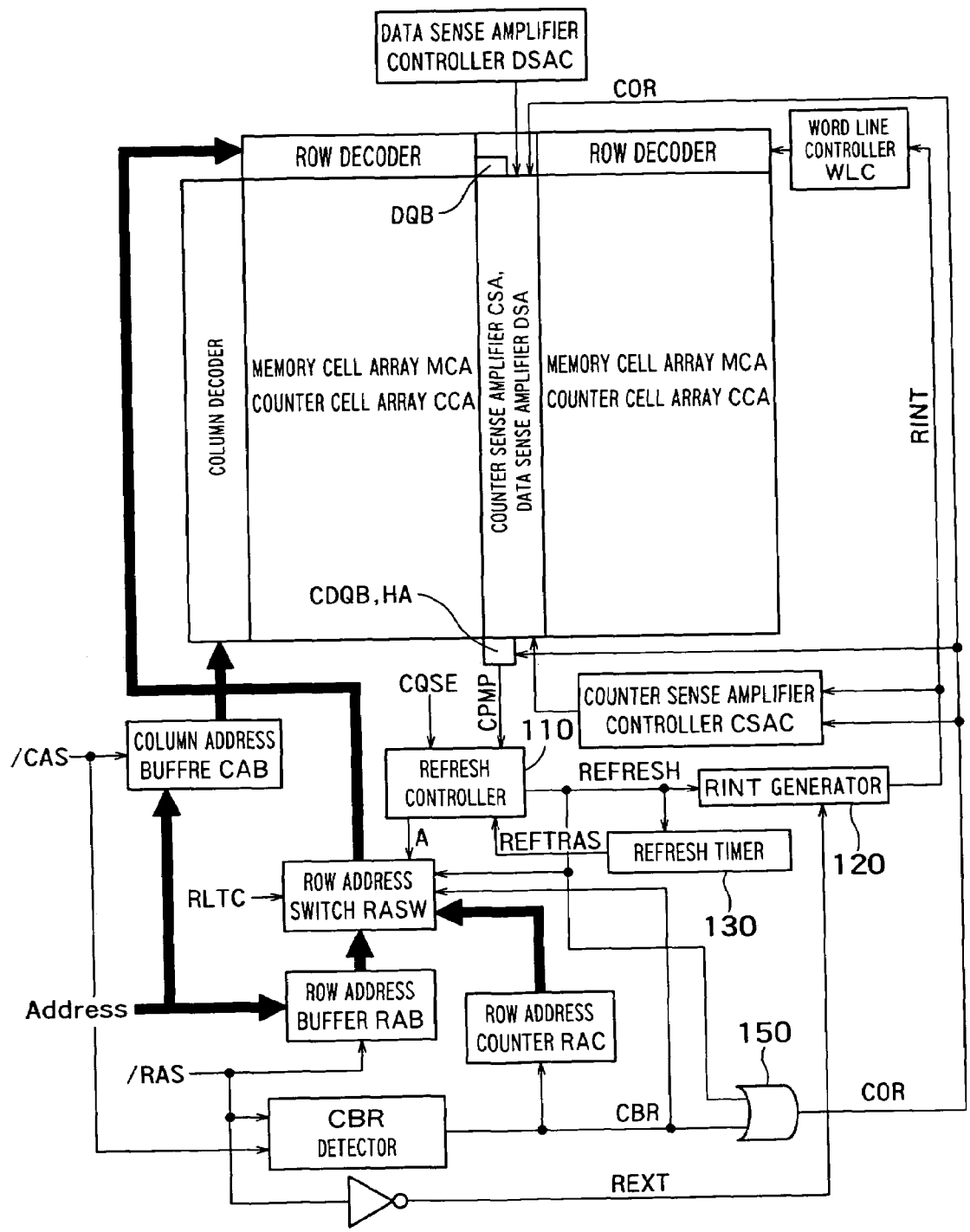
FIG. 22 is a block diagram showing a configuration of a semiconductor memory device 400 according to a second embodiment of the present invention.

FIG. 22 is a block diagram showing a configuration of a semiconductor memory device 400 according to a second embodiment of the present invention. The second embodiment differs from the first embodiment in that a COR signal generator 150 is provided. The COR signal generator 150 inputs the CAS before RAS signal CBR and the refresh signal REFRESH, and outputs a COR signal as an OR signal therebetween. The COR signal is employed by the data sense amplifier DSA as shown in FIG. 23.

Figure 23:
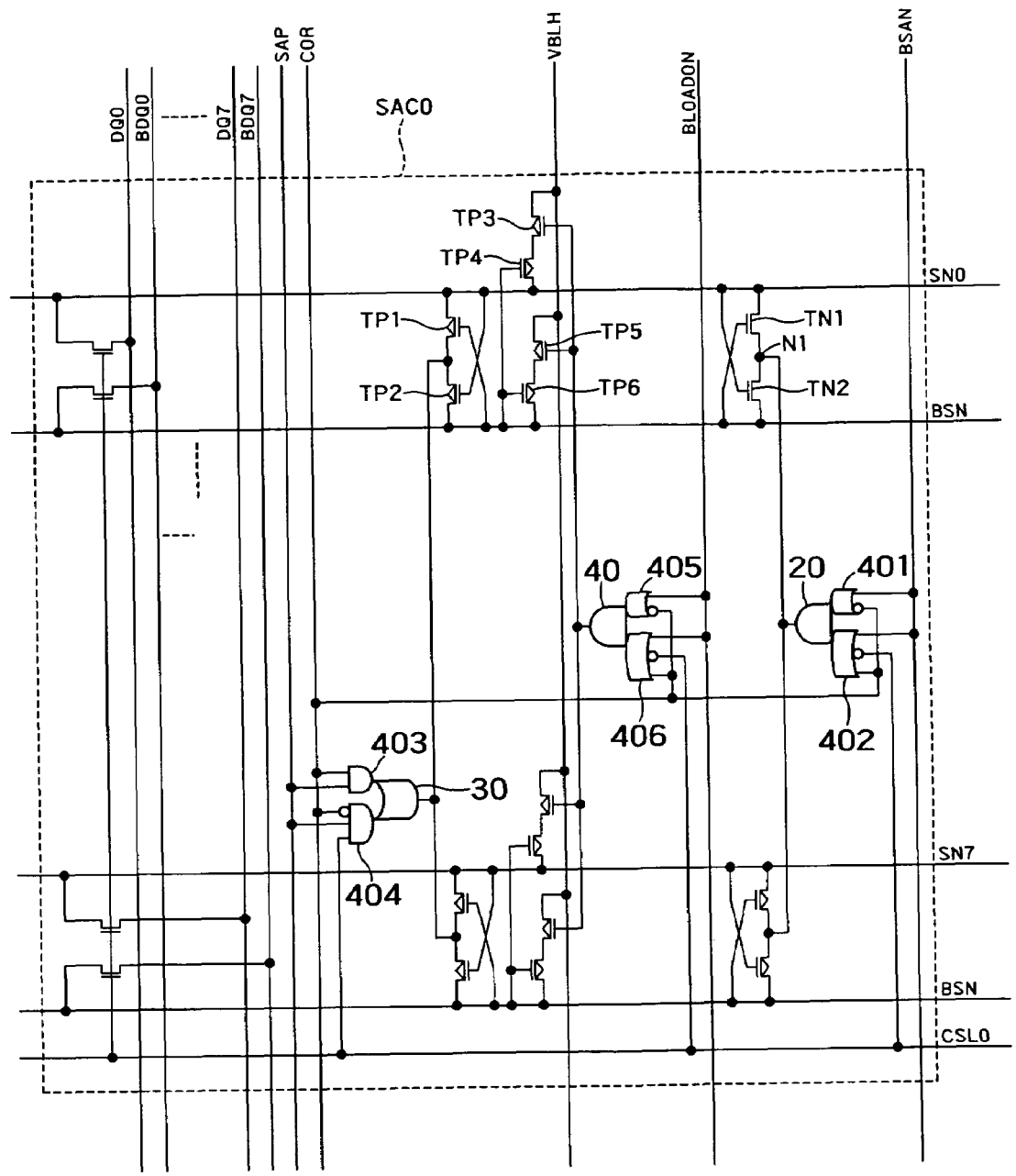
FIG. 23 is a circuit diagram of the sense amplifier core SAC0 of the semiconductor memory device 400.

FIG. 23 is a circuit diagram of the sense amplifier core SAC0 of the semiconductor memory device 400. The semiconductor memory device 400 includes OR gates 401 and 402 connected to two inputs of the AND gate 20, respectively, OR gates 405 and 406 connected to two inputs of the AND gate 40, respectively, and AND gates 403 and 404 connected to two inputs of the OR gate 30, respectively. The OR gate 401 inputs an inverted signal of the signal COR and a signal BSAN. The OR gate 402 inputs an inverted signal of the signal CSL0 and the signals COR and BSAN. The OR gate 405 inputs the inverted signal of the signal COR and the signal BLOADON. The OR gate 406 inputs the signals COR and BLODON and the inverted signal of the signal CSL0. The AND gate 403 inputs the signals COR and SAP. The AND gate 404 inputs the inverted signal of the signal COR and the signals SAP and CSL0. The signal COR is a signal that rises to HIGH if either the CAS before RAS signal CBR or the refresh signal REFRESH rises to HIGH.

Operations of the signals BSAN, BLOADON, SAP, and CSL0 may be the same as those in the refresh operation according to the first embodiment. The signals BSAN, BLOADON, and SAP are activated similarly in any cycle in the normal refresh operation, the normal read and write operation, and the extra refresh operation.

In the second embodiment, the semiconductor memory device 400 can execute the same operations as those according to the first embodiment even if the signal lines BLOADONi, BSANi, and SAPi extending in the column direction in parallel to the column select line CSL are not provided. It is, therefore, unnecessary to provide circuits for generating the signals of BLOADONi, BSANi, and SAPi. Further, the second embodiment exhibits the advantages as those of the first embodiment.

THIRD EMBODIMENT

Figure 24:
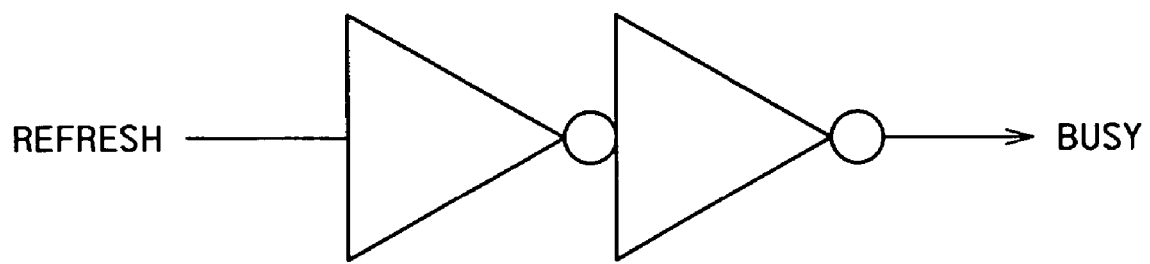
FIG. 24 shows a circuit that outputs the refresh signal REFRESH as the busy signal BUSY.

A semiconductor memory device according to a third embodiment outputs the refresh signal REFRESH or a busy signal BUSY based on the refresh signal REFRESH to an outside of the semiconductor memory device. FIG. 24 shows a circuit that outputs the refresh signal REFRESH as the busy signal BUSY. This circuit is connected to the output of the refresh controller 110 shown in FIG. 10. Other constituent elements of the semiconductor memory device according to the third embodiment may be the same as those of the semiconductor memory device according to the first or the second embodiment.

By outputting the busy signal BUSY to the outside of the semiconductor memory device, a user can be notified that the extra refresh operation is started. Further, the third embodiment exhibits the same advantages as those of the first or the second embodiment.

FOURTH EMBODIMENT

Figure 25:
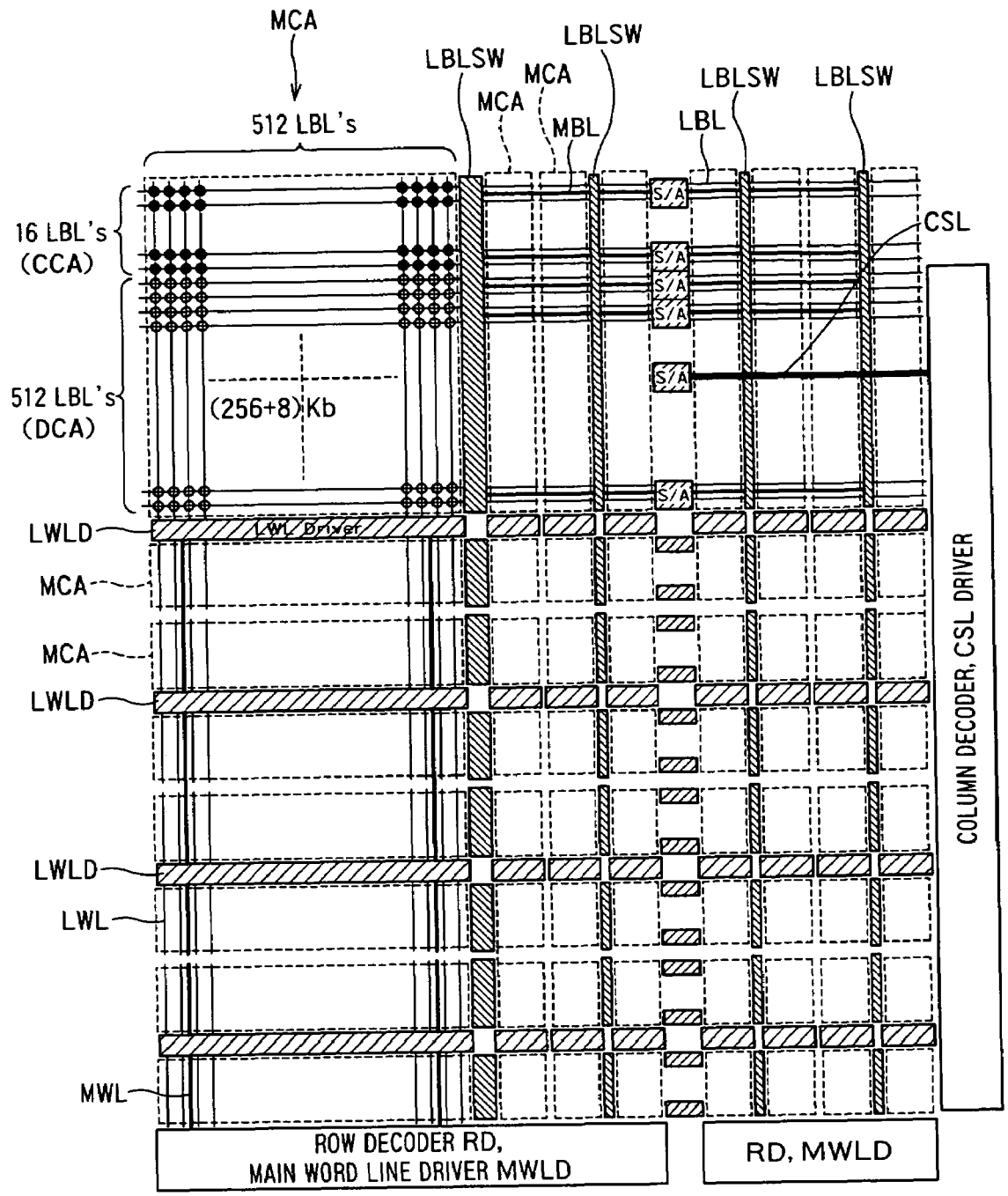
FIG. 25 is a block diagram showing a configuration of a semiconductor memory device 500 according to a fourth embodiment of the present invention.

FIG. 25 is a block diagram showing a configuration of a semiconductor memory device 500 according to a fourth embodiment of the present invention. The cell arrays DCA and CCA of the semiconductor memory device 500 include local bit lines LBL connected to memory cells MC arranged in the column direction and local word lines LWL connected memory cells MC arranged in the row direction. The semiconductor memory device 500 also includes a main bit line MBL connected to a plurality of local bit lines through local bit line switches LBLSW, a main word line MWL connected to a plurality of local word lines LWL through local word line drivers LWLD, and a row decoder/main word-line driver RD/MWLD connected to a plurality of local word line drivers LWLD. The main bit line MBL is connected to the sense amplifiers DSA and CSA. A structure in which a plurality of local bit lines LBL are connected to the main bit line MBL connected to the sense amplifiers is referred to as "a hierarchical bit line configuration". In this embodiment, the semiconductor memory device 500 has an open bit line configuration.

In the fourth embodiment, one local bit line switch LBLSW is configured to be able to connect one of the four local bit lines LBL to one main bit line MBL. Further, the local bit lines are connected to sense amplifier S/A trough the local bit line switch LBLSW arranged symmetric about the sense amplifiers S/A among the four local bit lines. The row decoder and main word line driver RD-MWLD is configured to be able to activate local word-lines via the main word lines MWL through the local word line drivers LWLD.

528 local bit lines LBL are provided in one memory cell array MCA. Among them, 512 first local bit lines LBL are used to store data and 16 second local bit lines LBL are used as counters. Further, 512 local word lines LWL are provided in one memory cell array MCA. The 512 first local bit lines LBL can store data of 256 kilobits. The 16 second local bit lines LBL can store counter data of eight kilobits. 64 memory cell arrays MCA thus configured in eight rows and eight columns are provided.

The sense amplifiers S/A are arranged in a central portion of the memory cell arrays in the row direction.

In the fourth embodiment, if the refresh request signal REFREQ falls, the extra refresh operation is repeated twice by changing the local bit line switch. If so, two extra refresh operations are executed during two consecutive RAS precharge periods so as to refresh all the memory cells MC connected to the certain local word line LWL.

Figure 26:
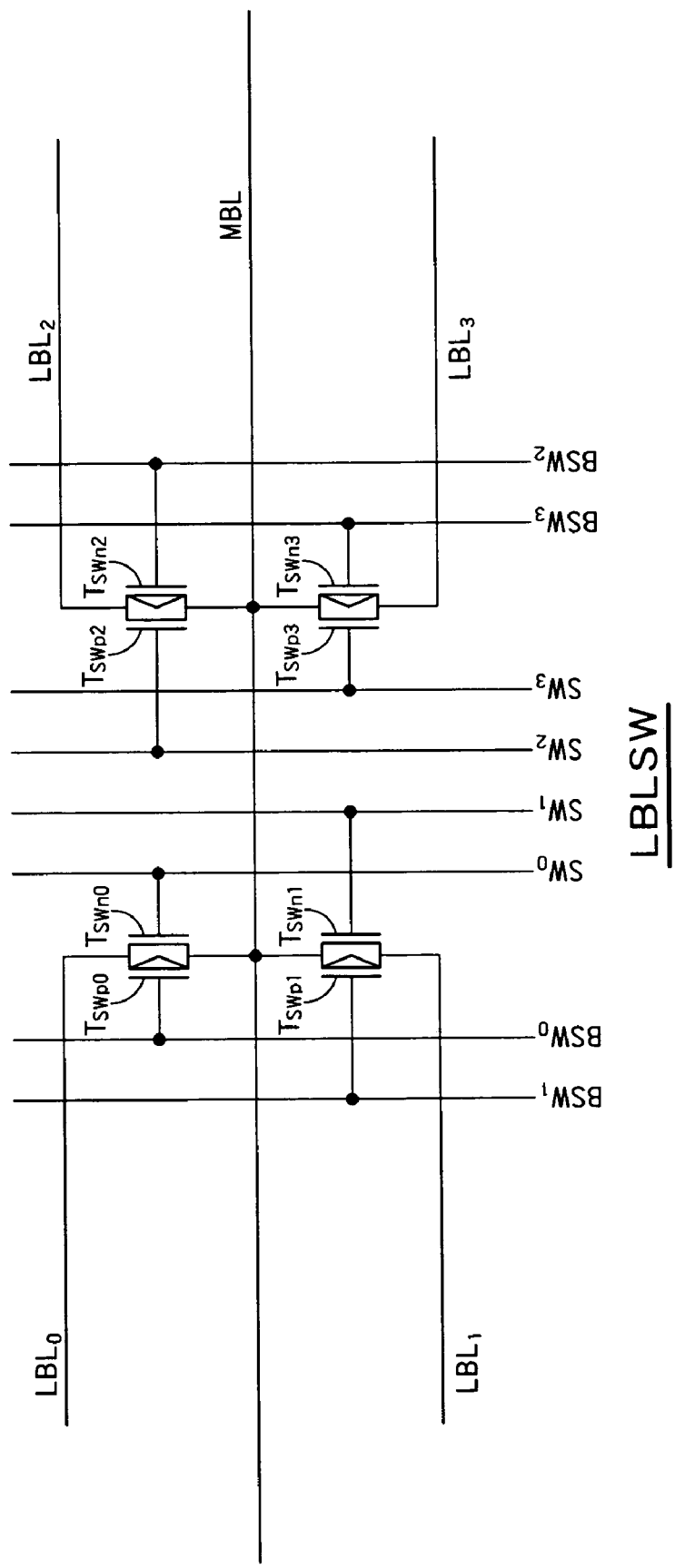
FIG. 26 is a circuit diagram showing a configuration of the first local bit line switch LBLSW for data.

FIG. 26 is a circuit diagram showing a configuration of the first local bit line switch LBLSW for data. The first local-bit-line switch LBLSW is a switching circuit configured by a CMOS transfer gate. The first local-bit-line switch LBLSW includes switching elements $T_{SWni}$ and $T_{SWpi}$ connected between a main bit lines MBL and a local bit line LBLi. Signals SWi and BSWi corresponding to the local bit line LBLi connected to the main bit line MBL are HIGH and LOW in advance, respectively. By doing so, the switching elements $T_{SWni}$ and $T_{SWpi}$ are turned on so that the main bit line MBL and the local bit line LBLi are equal in potential. At this time, switching elements $T_{SW}$ between unselected local bit lines LBL and the main bit lines MBL are kept to be turned off.

Since a configuration of the second local-bit-line switch LBLSW connected to the counter cells CC is equal to that shown in FIG. 26, it will be described with reference to FIG. 26. 16 counter cells CC are provided per local word line. Among them, eight counter cells CC0 to CC7 are connected to a first group configured by eight second local bit lines LBL connected to eighth main bit lines MBL. The remaining eight counter cells CC8 to CC15 are connected to a second group configured by eight second local bit lines LBL different from those of the first group. The counter cells CC0 to CC7 are connected to, for example, eight second local bit lines LBL0 to LBL14 (even LBLs), respectively, and the counter cells CC8 to CC15 are connected to, for example, eight second local bit lines LBL1 to LBL15 (odd LBLs), respectively.

Figure 27:
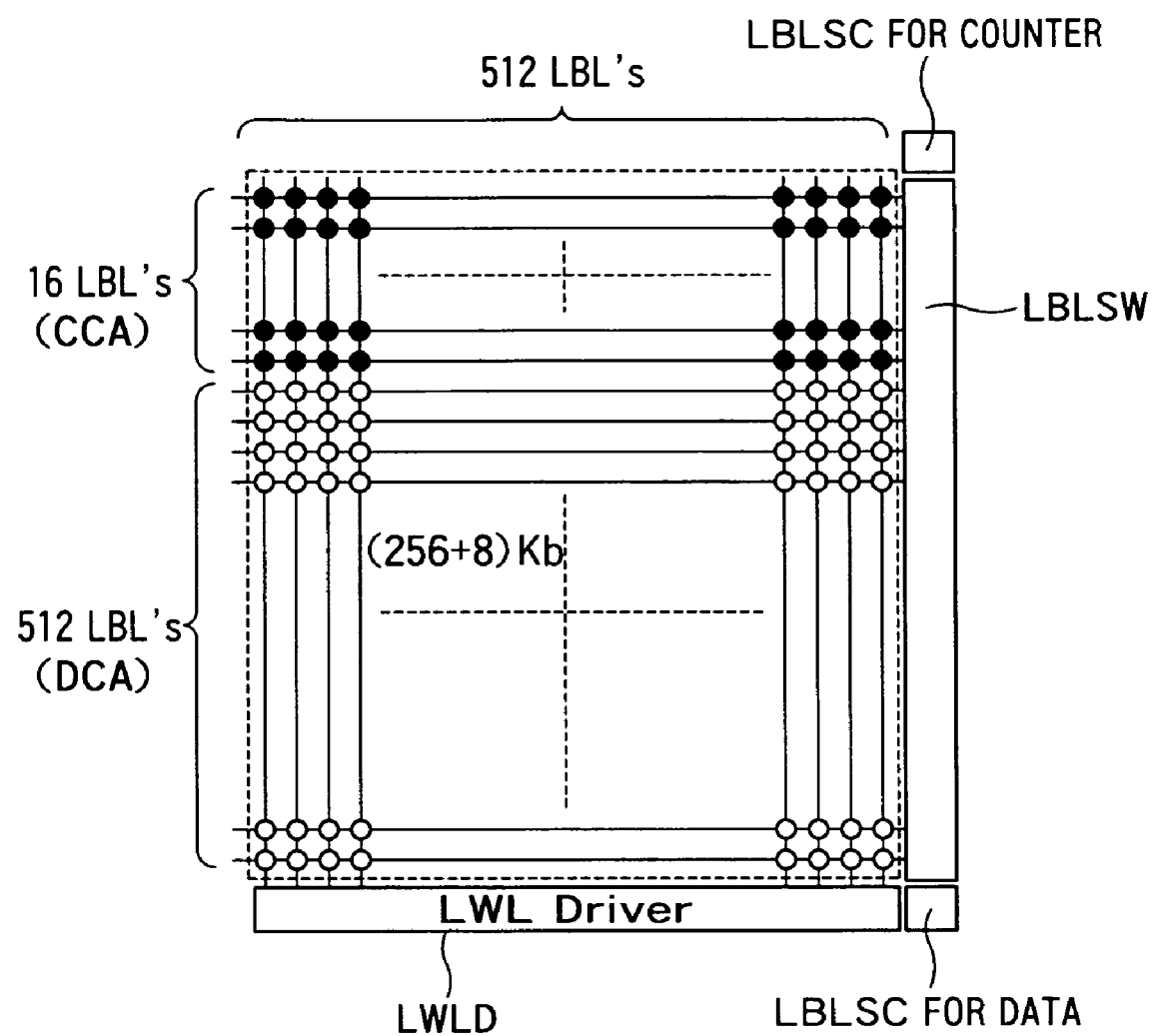
FIG. 27 is a block diagram of a LBL switch control circuit LBLSC that controls the local bit line switch LBLSW.

As shown in FIG. 27, a LBL switch control circuit LBLSC that controls the local bit line switch LBLSW includes a counter-LBL-switch control circuit LBLSC that controls the second local-bit-line switch LBLSW used for the counter cells CC, and a data-LBL-switch control circuit LBLSC that controls the second local-bit-line switch LBLSW used for the data memory cells MC. The counter-LBL-switch control circuit LBLSC and the data-LBL-switch control circuit LBLSC can operate independently of each other.

Operations according to the fourth embodiment are basically the same as those according to the first embodiment except in the following respects.

(First Difference)

In the counter cell array CCA, a plurality of local bit lines are connected to the main bit line MBL. It is, therefore, necessary to execute the extra refresh operation by as much as the number of local bit lines connected to this main bit line MBL for a given local WL (twice in this case). More specifically, if the number of times of activation of a certain local word line LWL reaches 256, a memory cell MC connected to one of a plurality of local bit lines LBL and to this local word line LWL is extra-refreshed during a next precharge period. Further, a memory cell MC connected to the other one of the local bit lines LBL and to the local word line LWL are extra-refreshed during a BRAS precharge period in a next cycle. For example, during the BRAS precharge period right after the number of times of activation reaches 256, the memory cell MC connected to the local bit line LBL0 shown in FIG. 26 and to the local word line LWL is refreshed. During the next BRAS precharge period, the memory cell MC connected to the local bit line LBL1 shown in FIG. 26 and the local word line LWL is refreshed. In other words, according to this embodiment, at least two continuous BRAS precharge periods after activation of the refresh request signal REFREQ, the memory cells MC connected to a plurality of local bit lines LBL connected to a certain local word line LWL are refreshed.

(Second Difference)

In the counter cell array CCA according to this embodiment, 16 counter cells CC0 to CC15 are connected to a certain local word line LWL. In the normal read and write operation, data on the number of times of activation ("number-of-times-of-activation data") stored in the eight counter cells CC0 to CC7 is read. This number-of-times-of-activation data is incremented and then written back to the counter cells CC0 to CC7, respectively. At the same time, the same number-of-times-of-activation data is written to the counter cells CC8 to CC15, respectively. Namely, the counter local bit line switch control circuit LBLS controls the local bit line switch LBLSW to write back the incremented number-of-times-of-activation data to the counter cells CC0 to CC7, and then to write the same incremented number-of-times-of-activation data then to the counter cells CC8 to CC15. Thus, among the 16 counter cells CC0 to CC15 belonging to the same main bit line MBL, the eight counter cells CC0 to CC7 connected to a certain second local bit line LBL and the eight counter cells CC8 to CC15 connected to the other second local bit line LBL store the same number-of-times-of-activation data. It is thereby possible to read the accurate number of times of activation whichever second local bit line is selected from among those connected to this main bit line MBL.

While in the fourth embodiment, the word lines are configured into a hierarchical structure similarly to the bit lines, the word lines are not necessarily configured into the hierarchical structure.

FIFTH EMBODIMENT

Figure 28:
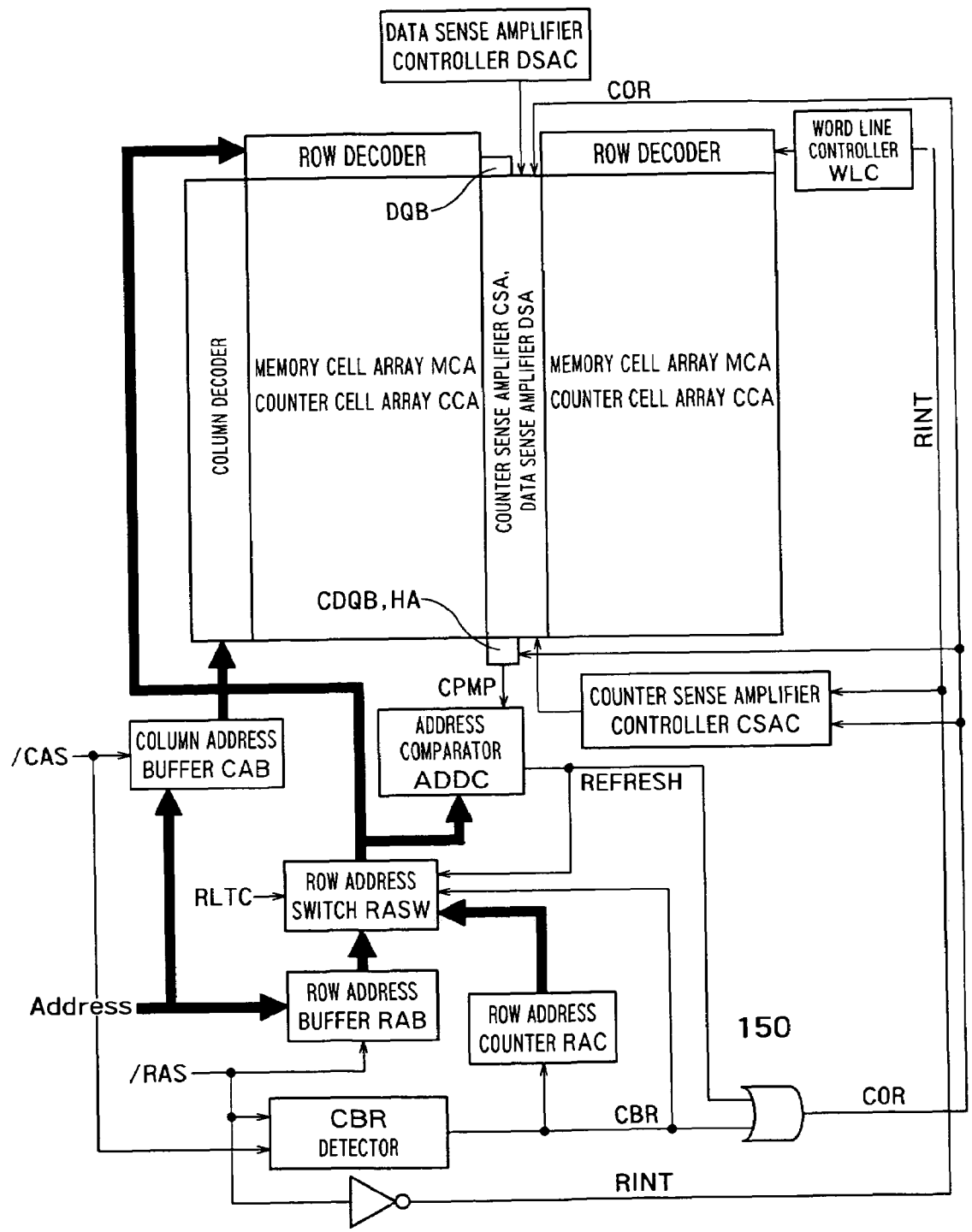
FIG. 28 is a block diagram showing a configuration of a semiconductor memory device 600 according to a fifth embodiment of the present invention.

FIG. 28 is a block diagram showing a configuration of a semiconductor memory device 600 according to a fifth embodiment of the present invention. The fifth embodiment differs from the second embodiment in that an address comparator ADDC is provided in place of the refresh controller 110.

In response to the refresh request signal REFREQ or the signal CPMP, the address comparator ADDC acquires a row address RA1 activated at this time from a row address buffer RAB. The address comparator ADDC acquires a row address RA2 input after the row address RA1 from the row address buffer RAB. The address comparator ADDC then compares the row address RA2 with the row address RA1. If the row addresses RA1 and RA2 coincide with each other, the address comparator ADDC outputs the refresh signal REFRESH to execute the extra refresh operation.

In the normal refresh operation, even if the signal CBR is output, the address comparator ADDC compares a row address RA3 from the row address counter RAC with the row address RA1. If the row addresses RA3 and RA1 coincide with each other, the address comparator ADDC outputs the refresh signal REFRESH.

Likewise, in the read/write operation, the address comparator ADDC compares a row address RA4 from the row address buffer RAB with the row address RA1. If the row addresses RA4 and RA1 coincide with each other, the address comparator ADDC outputs the refresh signal REFRESH. In this case, despite the read/write operation, memory cells MC connected to a word line at the row address RA1 are refreshed.

A plurality of address comparators ADDC may be provided. Each address comparator ADDC can store addresses of a plurality of word lines the number of times of activation of each of which reaches a predetermined value. Therefore, even if the number of times of activation of a word line at the other row address RA5 reaches the predetermined value while a certain address comparator ADDC stores the row address RA1 and awaits selection of the next row address RA1, the other address comparator ADDC can store the row address RA5.

In the first to the fifth embodiments, one number-of-times-of-activation data is stored in the counter cells CC of eight bits belonging to the same cell array. Alternatively, one number-of-times-of-activation data may be divided into data elements of one bit or a plurality of bits, and the divided data elements may be stored in counter cells CC belonging to a plurality of cell arrays, respectively. For example, the number-of-times-of-activation data may be divided into data elements of one bit and the one-bit data elements may be stored in the counter cells belonging to eighth difference cell arrays, respectively. Alternatively, the number-of-times-of-activation data may be divided into data elements of two bit and the two-bit data elements may be stored in the counter cells belonging to four difference cell arrays, respectively. In these cases, the counter cells of the eight bits provided in a plurality of cell arrays, respectively, are activated simultaneously.

Since the counter cells CC are provided in a plurality of cell arrays, the number of counter cells belonging to the each memory cell array MCA can be reduced. For example, if the counter cells CC are provided in four different cell arrays by two bits, respectively, the number of counter cells belonging to each memory cell array MCA suffices to two bits per word line. It is thereby possible to reduce an area of the counter cells CC and therefore reduce a chip size.

In the first to the fifth embodiments, after the power is turned on, the counter cells CC need to be initialized before the semiconductor memory device is used. The "initialization" means that data is logically set to data "0" relative to signals DQ and BDQ. To initialize the counter cells CC, all the word lines are refreshed after the power is turned on and before the semiconductor memory device is used. More specifically, the normal refresh operation by the signal CBR is repeated by as much as the number of times by which all the word lines rise. In case of a product having 4K refresh cycles, the refresh operation is executed 4096 times. If it takes 100 ns to execute one refresh operation, a period necessary to execute all of these refresh operations is 4096× 100 ns≈410 μs.

Figure 29:
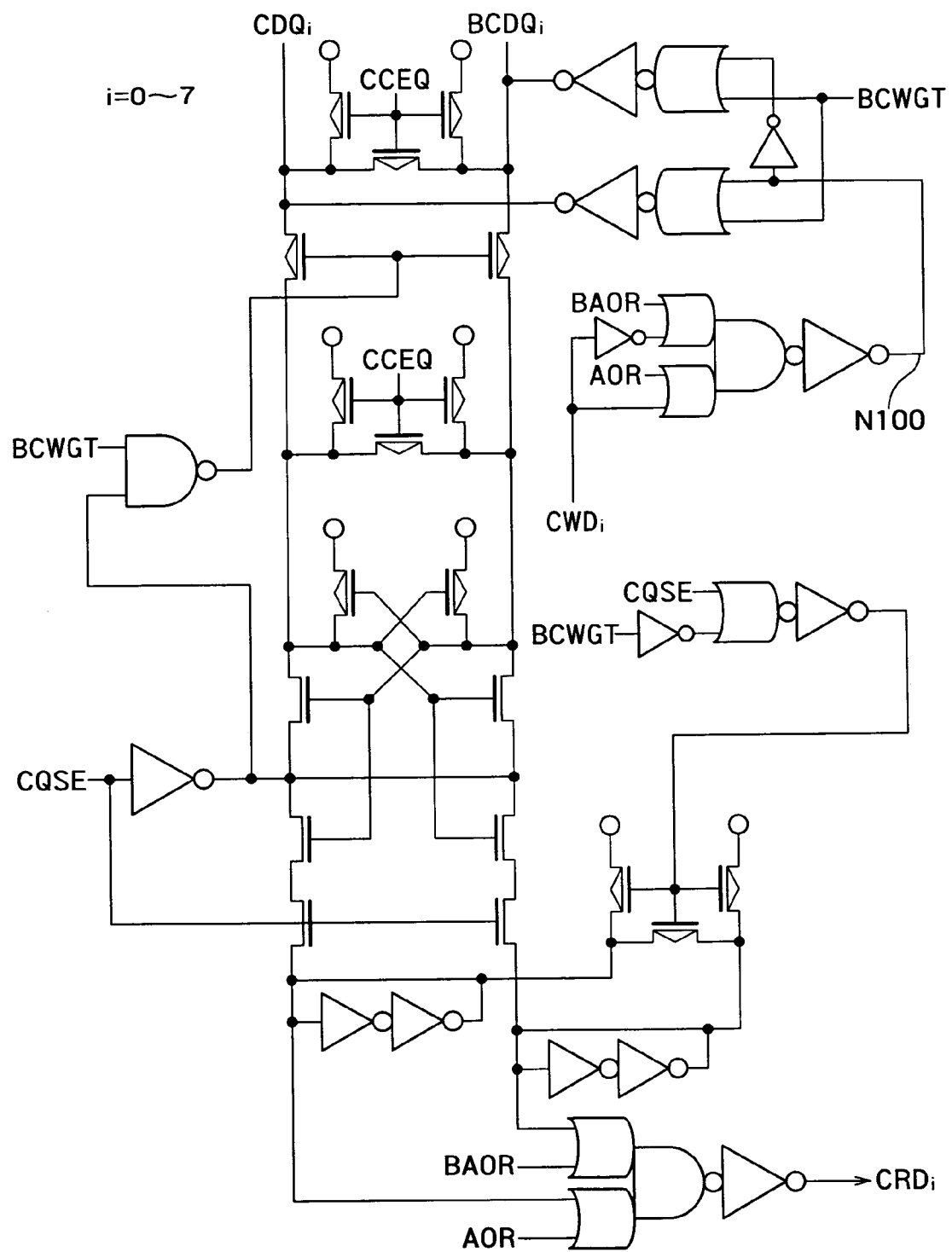
FIG. 29 shows a modification of the counter DQ buffer CDQB.

FIG. 29 shows a modification of the counter DQ buffer CDQB. According to this modification, the operation for initializing the counter cells (hereinafter, also referred to as "initial setting operation") is unnecessary. When the power is turned on, the word lines are kept at a low voltage VWLL (e.g., −1.5V if a source potential during data holding is 0V). As a result, after sufficient time (about several seconds) passes since the power is turned on, the data stored in all the counter cells CC is changed to "1". This is because holes are accumulated in the floating body of each memory cell MC by a leak current.

Logics of the memory cells connected to bit lines belonging to a DQ line are equal to that of the DQ line. Logics of the memory cells connected to bit lines belonging to a BDQ line are, however, opposite to that of the DQ line. In the semiconductor memory device having the folded bit line configuration as shown in the first embodiment, therefore, it is necessary to change a logic transmitted from the counter DQ buffer CDQB to the half adder HA and a logic returned from the half adder HA to the counter DQ buffer CDQB based on the least significant bit A0R of a row address.

For example, if the least significant bit A0R of the row address is data "1" (HIGH) and the data "1" (HIGH) of each counter cell CC in an initial state is transmitted to the signal line CDQi, a bit BA0R is LOW and a signal BCDQi is LOW. An output CRDi to the half adder HA is, therefore, LOW. If the least significant bit A0R of the row address is data "0" (LOW) and the data "1" (HIGH) of the counter cell CC in the initial state is transmitted to the signal line BCDQi, then the lowest bit A0R is LOW and the signal CDQi is LOW. The output CRDi to the half adder HA is, therefore, LOW. Since all data elements in the counter cells in initial states are "1", the initial value of the output CRDi of the counter data is "00000000" for all row addresses.

The input CWDi from the half adder HAi is also changed based on the least significant bit A0R. The input CWDi that is a non-incremented bit among the count data is the data "0". If the least significant bit A0R is the data "1", a node N100 is HIGH. Accordingly, the signal line CDQi is HIGH and the data "1" is written to the counter cells CC connected to the signal line CDQi. If the least significant bit A0R is the data "0", the node N100 is LOW. Accordingly, the signal line BCDQi is HIGH and the data "1" is written to the counter cells CC connected to the signal line BCDQi.

The input CWDi that is an incremented bit among the count data is the data "1". If the lowest bit A0R is the data "1", the data "0" is written to the counter cells CC connected to the signal line CDQi. If the lowest bit A0R is the data "0", the data "0" is written to the counter cells CC connected to the signal line BCDQi.

As can be seen, in the modification shown in FIG. 29, the initial state "00000000" of the count data can be generated using the initial states (data "1") of all the counter cells CC based on the least significant bit of the row address, and output to the half adder HA. Further, in this modification, the non-incremented bit among the count data from the adder HA can written back to the counter cells CC in the initial state "0" based on the least significant bit of the row address, and the incremented bit can be changed to the data "1" different from the initial state and the data "1" can be written back to the counter cells CC.

FIG. 29 shows the counter DQ buffer CDQB corresponding to the semiconductor memory device having the folded bit line configuration. In the semiconductor memory device having the open bit line configuration, the logic of the DQ line and those of the counter cells CC are changed depending on to which cell array the counter cells CC belong, the cell array on the left of the sense amplifier or the cell array on the right thereof. The addresses A0R and BA0R shown in FIG. 29 may be, therefore, replaced by more significant addresses, for example, A10R and BA10R, respectively. The A10R is the eleventh row address for determining to which array the counter cells CC belong, the cell array on the right of the sense amplifier or on the left of the sense amplifier. It is assumed, for example, that addresses are allocated to the memory cells such that the address A10R of the memory cell located on the left of the sense amplifier is LOW and that of the memory cell located on the right of the sense amplifier is HIGH.

If the initial states (data "1") of all the counter cells CC are thus used without executing the initial setting operation, time required until the data elements of the counter cells CC turn "1" after the power is turned on is considered to be a few seconds at room temperature (up to 25° C.).

Figure 30:
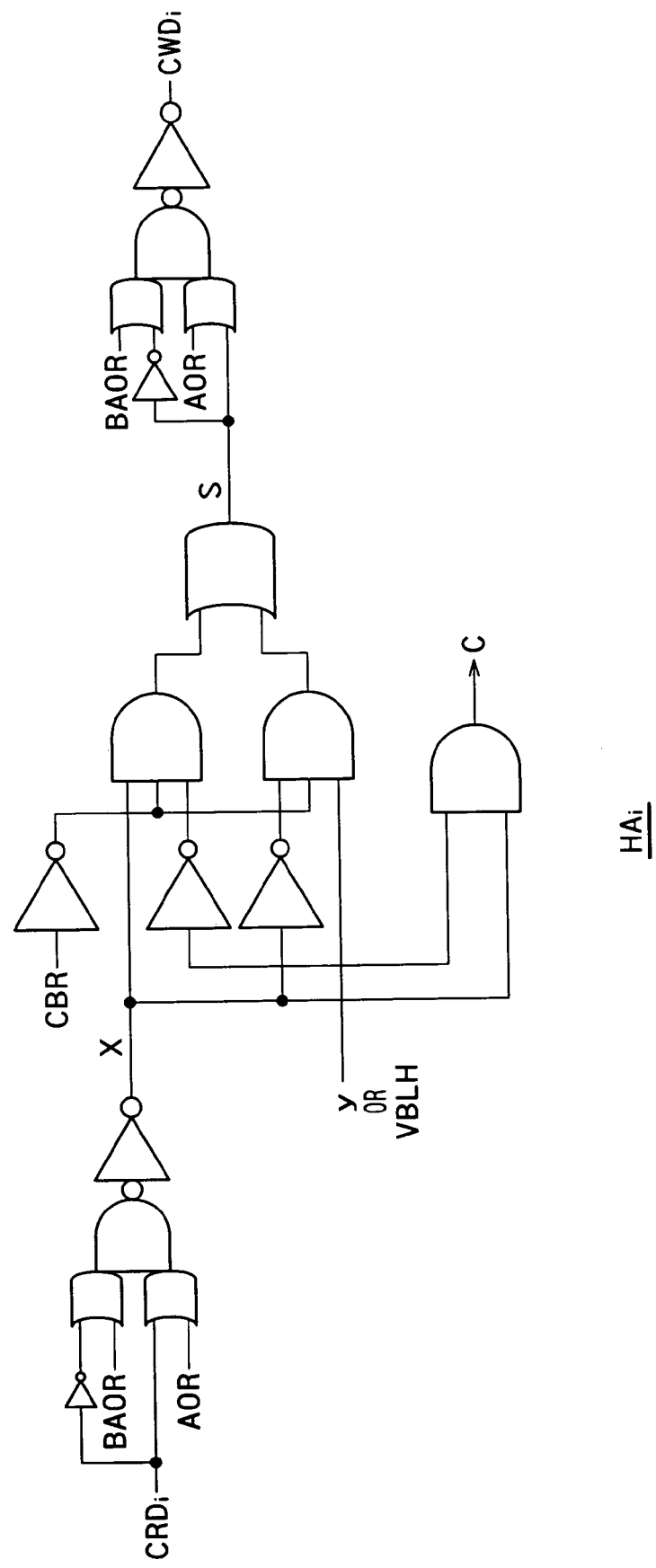
FIG. 30 is a circuit diagram showing a modification of the half adder HAi.

FIG. 30 is a circuit diagram showing a modification of the half adder HAi. In this modification, the half adder HA shown in FIG. 9 is changed to that shown in FIG. 30 while using the counter DQ buffer CDQBi shown in FIG. 8, whereby it is possible to dispense with the initial setting operation.

The invention claimed is:

1. A semiconductor memory device comprising:
a memory cell including a floating body region and storing data on the basis of the amount of charges in the floating body region;
a memory cell array including a plurality of the memory cells;
word lines connected to the memory cells arranged in rows of the memory cell array;
a counter cell array including counter cells provided to correspond to the word lines, the counter cell array storing the number of times of activation of the word lines;
an adder incrementing the number of times of activation of one of the word lines, the number of times of activation being read from the counter cell array in read operation of the data from the memory cell or in write operation of the data to the memory cell;
a counter buffer circuit temporarily storing the number of times of activation of the word line and writing back the incremented number of times of activation of the word line to the counter cell array;
a refresh request circuit outputting an instruction to execute a refresh operation to the memory cells connected to the word line when the number of times of activation of the word line reaches a predetermined value;
data bit lines connected to the memory cells in columns of the memory cell array;
a data sense amplifier provided to correspond to the data bit lines and detecting data of the memory cell;
a data buffer circuit provided to correspond to the data sense amplifier and amplifying the data detected by the data sense amplifier;
a counter bit line connected to the counter cell in a column of the counter cell array; and
a counter sense amplifier provided to correspond to the counter bit line and detects the data of the counter cell.

2. The semiconductor memory device according to claim 1, wherein
the data sense amplifier detects the data on selected data bit lines among the data bit lines in the read operation of the data from the memory cell or in the write operation of the data to the memory cell, and
the data sense amplifier selects all of the plurality of data bit lines when the refresh operation is executed.

3. The semiconductor memory device according to claim 1, wherein the data sense amplifier detects the data on the data bit line based on a result of a logic operation performed between a signal line extending in a row direction and a signal line extending in a column direction, the signal line extending in the column direction including selection information on the data bit line connected to the data sense amplifier corresponding to the signal line extending in the column direction.

4. A semiconductor memory device comprising:

a memory cell including a floating body region and storing data on the basis of the amount of charges in the floating body region;

a memory cell array including a plurality of the memory cells;

word lines connected to the memory cells arranged in rows of the memory cell array;

a counter cell array including counter cells provided to correspond to the word lines, the counter cell array storing the number of times of activation of the word lines;

an adder incrementing the number of times of activation of one of the word lines, the number of times of activation being read from the counter cell array in read operation of the data from the memory cell or in write operation of the data to the memory cell;

a counter buffer circuit temporarily storing the number of times of activation of the word line and writing back the incremented number of times of activation of the word line to the counter cell array;

a refresh request circuit outputting an instruction to execute a refresh operation to the memory cells connected to the word line when the number of times of activation of the word line reaches a predetermined value; and wherein the refresh operation is executed during a precharge period between the read or write operation and a next read or write operation.

5. A semiconductor memory device comprising:

a memory cell including a floating body region and storing data on the basis of the amount of charges in the floating body region;

a memory cell array including a plurality of the memory cells;

word lines connected to the memory cells arranged in rows of the memory cell array;

a counter cell array including counter cells provided to correspond to the word lines, the counter cell array storing the number of times of activation of the word lines;

an adder incrementing the number of times of activation of one of the word lines, the number of times of activation being read from the counter cell array in read operation of the data from the memory cell or in write operation of the data to the memory cell;

a counter buffer circuit temporarily storing the number of times of activation of the word line and writing back the incremented number of times of activation of the word line to the counter cell array;

a refresh request circuit outputting an instruction to execute a refresh operation to the memory cells connected to the word line when the number of times of activation of the word line reaches a predetermined value;

a first flip-flop circuit latching a refresh request signal based on an output signal from the refresh request circuit; and a second flip-flop circuit outputting a refresh signal for starting the refresh operation based on the refresh request signal during a precharge period between the read or write operation and a next read or write operation.

6. The semiconductor memory device according to claim 5, further comprising:

a delay circuit feeding back a delay signal obtained by delaying the refresh signal to the refresh controller and determining an end of the refresh operation.

7. A semiconductor memory device comprising:

a memory cell including a floating body region and storing data on the basis of the amount of charges in the floating body region;

a memory cell array including a plurality of the memory cells;

word lines connected to the memory cells arranged in rows of the memory cell array;

a counter cell array including counter cells provided to correspond to the word lines, the counter cell array storing the number of times of activation of the word lines;

an adder incrementing the number of times of activation of one of the word lines, the number of times of activation being read from the counter cell array in read operation of the data from the memory cell or in write operation of the data to the memory cell;

a counter buffer circuit temporarily storing the number of times of activation of the word line and writing back the incremented number of times of activation of the word line to the counter cell array;

a refresh request circuit outputting an instruction to execute a refresh operation to the memory cells connected to the word line when the number of times of activation of the word line reaches a predetermined value; and wherein while the refresh operation is executed, a busy signal based on the refresh signal is output to an outside of the semiconductor memory device.

8. A semiconductor memory device comprising:

a memory cell including a floating body region and storing data on the basis of the amount of charges in the floating body region;

a memory cell array including a plurality of the memory cells;

word lines connected to the memory cells arranged in rows of the memory cell array;

a counter cell array including counter cells provided to correspond to the word lines, the counter cell array storing the number of times of activation of the word lines;

an adder incrementing the number of times of activation of one of the word lines, the number of times of activation being read from the counter cell array in read operation of the data from the memory cell or in write operation of the data to the memory cell;

a counter buffer circuit temporarily storing the number of times of activation of the word line and writing back the incremented number of times of activation of the word line to the counter cell array;

a refresh request circuit outputting an instruction to execute a refresh operation to the memory cells connected to the word line when the number of times of activation of the word line reaches a predetermined value;
a first local bit line connected to the memory cells;
a first main bit line provided to correspond to a plurality of the first local bit lines;
a data sense amplifier provided to correspond to the first main bit line and detecting data of the memory cell;
a first switching circuit connected between the first main bit line and the first local bit line;
a second local bit line connected to the counter cell;
a second main bit line provided to correspond to a plurality of the second local bit lines;
a counter sense amplifier provided to correspond to the second main bit line and detects the data of the counter cell; and
a second switching circuit connected between the second main bit line and the second local bit line.

9. The semiconductor memory device according to claim 8, wherein
the second switching circuit is controlled independently of the first switching circuit.

10. The semiconductor memory device according to claim 8, wherein
the word lines include local word lines connected to the memory cells and the counter cell, and a main word line provided to correspond to the local word lines, wherein
the semiconductor memory device further comprises a local word line driver connected between the main word line and the local word line.

11. The semiconductor memory device according to claim 8, wherein
during a precharge period after the read operation of the data from the memory cell or after write operation of the data to the memory cell, the refresh operation is executed to a cell on a certain local bit line and on the activated word line, and
during a next precharge period, the refresh operation is executed to another cell on another one of the plurality of local bit lines and on the same word line which can be switched by the first switching circuit.

12. The semiconductor memory device according to claim 8, wherein
among the counter cells belonging to the second main bit line and on the same word line, the counter cell connected to one of the second local bit lines and the counter cell connected to another one of the second local bit lines store the number of times of activation equal to each other.

13. A semiconductor memory device comprising:
a memory cell including a floating body region and storing data on the basis of the amount of charges in the floating body region;
a memory cell array including a plurality of the memory cells;
word lines connected to the memory cells arranged in rows of the memory cell array; a counter cell array including counter cells provided to correspond to the word lines, the counter cell array storing the number of times of activation of the word lines;
an adder incrementing the number of times of activation of one of the word lines, the number of times of activation being read from the counter cell array in read operation of the data from the memory cell or in write operation of the data to the memory cell;
a counter buffer circuit temporarily storing the number of times of activation of the word line and writing back the incremented number of times of activation of the word line to the counter cell array;
a refresh reciuest circuit outputting an instruction to execute a refresh operation to the memory cells connected to the word line when the number of times of activation of the word line reaches a predetermined value; and
wherein
data on the number of times of activation is divided into data elements each consisting of one bit or a plurality of bits, and the divided data elements are stored in a plurality of the counter cells belonging to the counter cell arrays.

14. A semiconductor memory device comprising:
a memory cell including a floating body region and storing data on the basis of the amount of charges in the floating body region;
a memory cell array including a plurality of the memory cells;
word lines connected to the memory cells arranged in rows of the memory cell array;
a counter cell array including counter cells provided to correspond to the word lines, the counter cell array storing the number of times of activation of the word lines;
an adder incrementing the number of times of activation of one of the word lines, the number of times of activation being read from the counter cell array in read operation of the data from the memory cell or in write operation of the data to the memory cell;
a counter buffer circuit temporarily storing the number of times of activation of the word line and writing back the incremented number of times of activation of the word line to the counter cell array;
a refresh request circuit outputting an instruction to execute a refresh operation to the memory cells connected to the word line when the number of times of activation of the word line reaches a predetermined value; and
wherein
after a power of the semiconductor memory device is turned on, the refresh operation is executed to the counter cell so as to initialize the counter cell.

15. A semiconductor memory device comprising:
a memory cell including a floating body region and storing data on the basis of the amount of charges in the floating body region;
a memory cell array including a plurality of the memory cells;
word lines connected to the memory cells arranged in rows of the memory cell array;
a counter cell array including counter cells provided to correspond to the word lines, the counter cell array storing the number of times of activation of the word lines;
an adder incrementing the number of times of activation of one of the word lines, the number of times of activation beina read from the counter cell array in read operation of the data from the memory cell or in write operation of the data to the memory cell;
a counter buffer circuit temporarily storing the number of times of activation of the word line and writing back the incremented number of times of activation of the word line to the counter cell array;
a refresh request circuit outputtina an instruction to execute a refresh operation to the memory cells connected to the word line when the number of times of activation of the word line reaches a predetermined value; and wherein after a power of the semiconductor memory device is turned on, the counter cell is set into a standby state during a period equal to or longer than a data retention period of the counter cell, and the data of all of a plurality of counter cells are logically made equal.

16. The semiconductor memory device according to claim 15, wherein the counter buffer circuit or the adder changes a logic of the data transmitted from the counter buffer circuit to the adder and the logic of the data returned from the adder to the counter buffer based on an address of the word line.

\* \* \* \* \*